United States Patent [19]

Cao et al.

[11] Patent Number: 5,232,631
[45] Date of Patent: Aug. 3, 1993

[54] PROCESSIBLE FORMS OF ELECTRICALLY CONDUCTIVE POLYANILINE

[75] Inventors: Yong Cao, Goleta; Paul Smith; Alan J. Heeger, both of Santa Barbara, all of Calif.

[73] Assignee: Uniax Corporation, Santa Barbara, Calif.

[21] Appl. No.: 714,165

[22] Filed: Jun. 12, 1991

[51] Int. Cl.$^5$ .............................................. H01B 1/00
[52] U.S. Cl. ..................................... 252/500; 252/518; 524/81; 528/422; 528/210; 528/214; 528/215; 528/423; 528/424
[58] Field of Search .................. 252/500, 518; 524/81; 528/422

[56] References Cited

U.S. PATENT DOCUMENTS

| | | | |
|---|---|---|---|
| 3,963,498 | 6/1976 | Trevoy | 252/500 |
| 4,025,463 | 5/1977 | Trevoy | 252/500 |
| 4,526,706 | 7/1985 | Upson et al. | 252/500 |
| 4,556,623 | 12/1985 | Tamura et al. | 430/83 |
| 4,604,427 | 8/1986 | Roberts et al. | 525/185 |
| 4,759,986 | 7/1988 | Marikar et al. | 428/389 |
| 4,772,421 | 9/1988 | Ikenaga et al. | 252/500 |
| 4,781,971 | 11/1988 | Marikar et al. | 428/212 |
| 4,851,487 | 7/1989 | Yaniger et al. | 252/500 |
| 4,855,361 | 8/1989 | Yaniger et al. | 252/500 |
| 4,893,908 | 1/1990 | Wolf et al. | 350/357 |
| 4,915,985 | 4/1990 | Gould et al. | 252/500 |
| 4,935,163 | 6/1990 | Cameron | 252/500 |
| 4,935,164 | 6/1990 | Wessling et al. | 252/500 |
| 4,963,206 | 10/1990 | Shacklette et al. | 156/99 |
| 4,983,322 | 1/1991 | Eisenbaumer | 252/500 |
| 4,983,690 | 1/1991 | Cameron et al. | 252/500 |
| 5,006,278 | 4/1991 | Eisenbaumer | 252/500 |
| 5,008,041 | 4/1991 | Cameron et al. | 252/500 |
| 5,017,420 | 5/1991 | Marikar et al. | 252/518 |
| 5,069,820 | 12/1991 | Jen et al. | 252/500 |
| 5,079,096 | 1/1992 | Miyake et al. | 252/500 |
| 5,093,439 | 3/1992 | Epstein et al. | 252/500 |
| 5,133,841 | 7/1992 | Higo et al. | 252/500 |

FOREIGN PATENT DOCUMENTS

| | | |
|---|---|---|
| 0218284 | 4/1987 | European Pat. Off. . |
| 61-195137 | 8/1986 | Japan . |
| 62-012073 | 1/1987 | Japan . |
| 62-047109 | 2/1987 | Japan . |
| 2-240163 | 9/1990 | Japan ................................ 252/500 |
| WO89/01694 | 2/1989 | PCT Int'l Appl. . |
| WO90/10297 | 9/1990 | PCT Int'l Appl. . |

OTHER PUBLICATIONS

Andreatta et al., *Mol. Cryst. Liq. Cryst.* (1990) 189:169–182.
Andreatta et al., *Polymer Comm.* (1990) 31(7):275–278.
Arjavalinghm et al., *J. Chem. Phys.* (1990) 93(1):6–9 (Abstract).
Cameron et al., *3rd International SAMPE Electronics Conference* (Jun. 20–22, 1989) pp. 1163–1174.
Chan et al., *Synth. Metals* (1989) 31(1):95–108 (Abstract).
Chan et al., *Synth. Metals.* (1990) 35(3):333–344 (Abstract).
Chiang et al., *Synth. Metals* (1986) 13:193–205.
Focke et al., *J. Phys. Chem.* (1987) 91:5813–5818.
Green et al., *J. Chem. Soc.* (1912) 101:1117–1123.
Kaner et al., *Scientific American* (1988) 258(2):106–111.
Kobayashi et al., *J. Electroanal. Chem.* (1984) 177:281–2911).
LaCroix et al., *Makromol. Chem. Macromol. Symp.* (1987)8:17–37.
LaCroix et al., *1st International SAMPE Electronics Conference* (Jun. 23–25, 1987) pp. 649–656.
Li et al., *Synth. Metals* (1991) 40:23–28.

(List continued on next page.)

Primary Examiner—Mark L. Bell
Assistant Examiner—Anthony J. Green
Attorney, Agent, or Firm—Morrison & Foerster

[57] ABSTRACT

Solutions and plasticized compositions of electrically conductive substituted and unsubstituted polyanilines in nonpolar organic fluid phases with functionalized protonic acids are disclosed as are methods of forming such solutions or compositions and use of same to form conductive articles.

42 Claims, 5 Drawing Sheets

OTHER PUBLICATIONS

MacDiarmid et al., *Papers from the 6th European Physical Society Industrial Workshop Eur. Phys. Soc.* Loftus, Norway, (May 28–31, 1990) (Abstract).

Malhotra et al., *J. Appl. Polymer Sci.* (1990) 40(5–6):1049–1052.

Monkman et al., *Synth. Metals* (1991) 40(1):87–96 (Abstract).

Salaneck et al., *Synth. Metals* (1986) 13:291–297.

Shacklette et al., *Symposium on Electroresponsive Molecular and Polymeric Systems,* Upton, New York, (Oct. 25–27, 1989) (Abstract).

Theophilou et al., *Electric Properties of Conjugated Polymers III Basic Models and Applications,* Proceedings of an International Winter School, (Mar. 11–18, 1989) Kirchberg, Austria, (Abstract).

PROCESSIBLE FORMS OF ELECTRICALLY CONDUCTIVE POLYANILINE

BACKGROUND OF THE INVENTION

1. Field of the Invention

This invention relates to conductive polymers and particularly to the use of functionalized protonic acids to induce processibility of electrically conductive substituted or unsubstituted polyanilines, and to induce solubility of electrically conductive substituted or unsubstituted polyanilines in organic liquids or fluid (melt) phases of solid polymers. Other aspects of this invention relate to the resulting solutions of electrically conductive substituted or unsubstituted polyanilines in organic liquids, to methods of forming such solutions and to methods of using such solutions to form conducting polymer articles and methods of using such solutions as electrically conducting liquids. Yet other aspects relate to solid phase polymers containing these protonic acids as plasticizers and their use in forming conductive articles.

2. Prior Art

There has recently been an increased interest in the electrical conductivity and electrochemistry of polymeric systems. Recently, work has intensified with emphasis on polymers having extended conjugation in the backbone chain.

One conjugated polymer system currently under study is polyaniline. Kobayashi Tetsuhiko et al., *J. Electroanal Chem.*, "Electrochemical Reactions Concerned With electrochromism of Polyaniline Film-Coated Electrodes," 177 (1984) 281-291, describes various experiments in which spectro electro-chemical measurement of a polyaniline film coated electrode were made. French Patent No. 1,519,729, French Patent of Addition 94,536; U.K. Patent No. 1,216,549; "Direct Current Conductivity of Polyaniline Sulfate," M. Donomedoff, F. Kautier-Cristojini, R. ReSur-vail, M. Jozefowicz, L. T. Yu, and R. Buvet, *J. Chim. Phys. Physicohim. Brol.*, 68, 1055 (1971); "Continuous Current Conductivity of Macromolecular Materials," L. T. Yu, M. Jozefowicz, and R. Buvet, *Chim. Macromol.*, 1,469 (1970); "Polyaniline Based Filmogenic Organic Conductive Polymers," D. LaBarre and M. Jozefowicz, *C. R. Read. Sci.*, Ser. C, 269, 964 (1969); "Recently Discovered Properties of Semiconducting Polymers," M. Jozefowicz, L. T. Yu, J. Perichon, and R. Buvet, *J. Polym. Sci.*, Part C, 22, 1187 (1967); "Electrochemical Properties of Polyaniline Sulfates," F. Cristojini, R. De Surville, and M. Jozefowicz, *Cr. Read. Sci.*, S r C, 268, 1346 (1979 ; "Electrochemical Cells Using Protolytic Organic Semiconductors," R. De Surville, M. Jozefowicz, L. T. Yu, J. Perichon, R. Buvet, *Electrochem. Ditn.* 13, 1451 (1968); "Oligomers and Polymers Produced by Oxidation of Aromatic Amines," R. De Surville, M. Jozefowicz, and R. Buvet, *Ann. Chem.* (Paris), 2,5 (1967) "Experimental Study of the Direct Current Conductivity of Macromolecular Compound," L. T. Yu, M. Borredon, M. Jozefowicz, G. Belorgey, and R. Buvet, *J. Polym. Sci. Polym. Symp.*, 16, 2931(1967); "Conductivity and Chemical Properties of Oligomeric Polyaniline," M. Jozefowicz, L. T. Yu, G. Belorgey, and R. Buvet, *J. Polym. Sci., Polym. Symp.*, 16, 2934 (1967); "Products of the Catalytic Oxidation of Aromatic Amines," R. De Surville, M. Jozefowicz, and R. Buvet, *Ann. Chem. (Paris)*, 2, 149 (1967); "Conductivity and Chemical Composition of Macromolecular Semiconductors," *Rev. Gen. Electr.*, 75 1014 (1966); "Relation Between the Chemical and Electrochemical Properties of Macromolecular Semiconductors," M. Jozefowicz and L. T. Yu, *Rev. Gen. Electr.*, 75, 1008 (1966); "Preparation, Chemical Properties, and Electrical Conductivity of poly-N-Alkyl Anilines in the Solid State," D. Muller and M. Jozefowicz, *Bull. Soc. Chem. Fr.*, 4087 (1972).

U.S. Pat. Nos. 3,963,498 and 4,025,463 describe oligomeric polyanilines and substituted polyanilines having not more than 8 aniline repeat units which are described as being soluble in certain organic solvents and which are described as being useful in the formation of semiconductors compositions. European Patent No. 00117717 is an apparent improvement in the compositions of U.S. Pat. Nos. 3,963,498 and 4,025,463 and states that the polyaniline can be formed into a latex composite through use of the oligomers of polyaniline and a suitable binder polymer.

High molecular weight polyaniline has emerged as one of the more promising conducting polymers, because of its excellent chemical stability combined with respectable levels of electrical conductivity of the doped or protonated material. Processing of polyaniline high polymers into useful objects and devices, however, has been problematic. Melt processing is not possible, since the polymer decomposes at temperatures below a softening or melting point. In addition, major difficulties have been encountered in attempts to dissolve the high molecular weight polymer.

Recently, it was demonstrated that polyaniline, in either the conducting emeraldine salt form or the insulating emeraldine base form, can processed from solution in certain strong acids to form useful articles (such as oriented fibers, tapes and the like). By solution processing from these strong acids, it is possible to form composites, or polyblends of polyaniline with other polymers (for example polyamides, aromatic polyamides (aramids), etc.) which are soluble in certain strong acids and thereby to make useful articles. "Electrically Conductive Fibers of Polyaniline Spun from Solutions in Concentrated Sulfuric Acid," A. Andreatta, Y. Cao, J. C. Chiang, A. J. Heeger and P. Smith, *Synth. Met.*, 26, 383 (1988 ; "X-Ray Diffraction of Polyaniline," Y. Moon, Y. Cao, P. Smith and A. J. Heeger, *Polymer Communications*, 30, 196 (1989); "Influence of the Chemical Polymerization Conditions on the properties of Polyaniline," Y. Cao, A. Andreatta, A. J. Heeger and P. Smith, *Polymer*, 30, 2305 (1990); "Magnetic Susceptibility of Crystalline Polyaniline," C. Fite, Y. Cao and A. J. Heeger, *Sol. State Commun.*, 70, 245 (1989); "Spectroscopy and Transient Photoconductivity of Partially Crystalline Polyaniline," S. D. Phillips, G. Yu, Y. Cao, and A. J. Heeger, *Phys. Rev.* B, 10702 (1989); "Spectroscopic Studies of Polyaniline in Solution and in the Solid State," Y. Cao and A. J. Heeger, *Synth. Met.* 32, 263, (1989); "Magnetic Susceptibility of One-Dimensional Chains in Solution," C. Fite, Y. Cao and A. J. Heeger, *Solid State Commun.*, 71, 607 (1990); "Electrically Conductive Polyblend Fibers of Polyaniline and Poly(p-phenylene terephthalamide)," A. Andreatta, A. J. Heeger and P. Smith, *Polymer Communications*, 31, 275 (1990); "Polyaniline Processed From Sulfuric Acid and in Solution in Sulfuric Acid: Electrical, Optical and Magnetic Properties," Y. Cao, P. Smith and A. J. Heeger in Conjugated Polymeric Materials: Opportunities in Electronics, Opto-electronics, and Molecular Electronics, ed. J. L. Bredas and R. R.

Chance (Kluwer Academic Publishers, The Netherlands, 1990).

U.S. Pat. No. 4,983,322 describes solutions and plasticized co positions of electrically conductive substituted and unsubstituted polyanilines and methods of forming such solutions or compositions and use of same to form conductive articles. The polyaniline materials were made soluble by the addition of an oxidizing agent such as $FeCl_3$. Since the resulting compounds are charge transfer salts, highly polar solvents were required; specifically solvents were needed with dielectric constants equal to or greater than 25 and with dipole moments equal to or greater than 3.25.

Starting with the insulating emeraldine base form, polyaniline can be rendered conducting through two independent doping routes:

(i) Oxidation either electrochemically (by means of an electrochemical charge transfer reaction) or chemically (by means of chemical reaction with an appropriate oxidizing agent such as $FeCl_3$);

(ii) Protonation through acid-base chemistry by exposure to protonic acids (for example, in aqueous environment with pH less than 2-3).

These two different routes lead to distinctly different final states. In (i), the oxidation causes a change in the total number of $\pi$-electrons on the conjugated chain and thereby renders it conductive. In (ii), there is no change in the number of electrons; the material is rendered electrically conductive by protonation of the imine nitrogen sites.

In the general field of conducting polyaniline, it was believed impossible to dope a high molecular weight polyaniline to the extent that it becomes a semiconductor or conductor and thereafter dissolve or plasticize the conductive form of polyaniline in common nonpolar or weakly polar organic solvents. As used herein, the terms "to plasticize" and a "plasticized composition" refer to the process and product in which a solid polymer includes an admixed liquid or semisolid phase to an extent sufficient to render the solid polymer flexible (softened) and not brittle. The liquid or semisolid additive is known as a "plasticizer." The nature of plasticized materials is described in more detail in Harry R. Allcock and Frederick W. Lampe, *Contemporary Polymer Chemistry*, Prentice-Hall, Inc. Englewood Cliffs, N.J. (1981), p. 13.

In the absence of solutions or plasticized forms, comprising common nonpolar or weakly polar liquids, or otherwise processible forms, the ability to form useful conductive articles out of conductive polyaniline, or composites or polyblends of conductive polyaniline with other polymers (for example polyethylene, polypropylene, polystyrene, elastomers, poly(ethylvinylacetate), etc.) is restricted. Thus, a need exists for techniques and materials to facilitate the fabrication of shaped conductive polyaniline articles, especially articles made from bulk material (conductive polyanilines and/or composites, or polyblends of conductive polyaniline with other polymers) and films, fibers and coatings.

SUMMARY OF THE INVENTION

One aspect of the present invention relates to solutions and plasticized polymeric compositions comprising polyaniline of film and fiber forming molecular weight, a solvent or plasticizing liquid selected from the group consisting of nonpolar or weakly polar organic solvents, or molten or liquidified oligomers or polymers, and a functionalized protonic acid solute in which the counter-ion has been functionalized to be compatible with nonpolar or weakly polar organic solvents. As used herein, a "functionalized protonic acid" is a protonic acid, generally denoted as $H^+(M^--R_p)$, in which the counterion anionic species, $(M^--R_p)$, contains the $R_p$ functional group or a connection to a polymer backbone which is chosen to be compatible with nonpolar or weakly polar organic liquids, or molten or liquidified oligomers or polymers. An illustrative example would be the following:

$M^- = SO_3-$ $R_p$ = dodecyl-benzene.

In cases where the functionalized protonic acid is a liquid, it may replace some or all of the solvent or plasticizing liquid as well.

Another aspect of the present invention relates to a method of forming the solution or plasticized composition of this invention by dissolving said polyaniline, said functionalized protonic acid, either separately or in combination as a protonated conductive polyaniline, in said solvent (plasticizing liquid).

Yet another aspect of this invention relates to a method of forming a conductive article from the solution or plasticized composition of this invention which compromises the steps of:

a. forming a solution or plasticized composition comprising polyaniline, a solvent selected from the group consisting of nonpolar or weakly polar organic liquids and a functionalized protonic acid solute; and b. removing all or a portion of said solvent from said solution or plasticized composition after or concurrent with shaping the solution into the desired article.

Yet another aspect of this invention relates to a method of forming a conductive article from the solution or plasticized composition of this invention which compromises the steps of:

a. forming a solution or plasticized composition comprising polyaniline, a solvent selected from the group consisting of non-polar or weakly polar organic liquid monomers and a functionalized protonic acid solute; and b. polymerizing the monomer in said solution or plasticized composition, after or concurrent with shaping the solution into the desired article.

Yet another aspect of this invention relates to methods of forming a conductive article which is a composite, or polyblend of conductive polyaniline with other polymers (for example polyethylene, polypropylene, polystyrene, elastomers, poly(ethylvinylacetate), polyvinylchloride, etc.) from the solution or plasticized composition of this invention which compromises the steps of:

a. forming a solution or plasticized composition comprising polyaniline, a solvent selected from the group consisting of nonpolar or weakly polar organic solvents and a functionalized protonic acid solute and a suitable fraction of one or more other polymers (for example polyethylene, polypropylene, polystyrene, elastomers, poly(ethylvinylacetate), polyvinylchloride, etc.); and b. removing all or a portion of said solvent from said solution or plasticized composition.

Yet another aspect of this invention relates to methods of forming a conductive article which is a composite, or polyblend of conductive polyaniline with other polymers (for example polyethylene, polypropylene, polystyrene, elastomers, poly(ethylvinylacetate), polyvinylchloride, etc.) from the solution or plasticized composition of this invention which compromises the steps of:

a. forming a solution or plasticized composition comprising polyaniline, a solvent selected from the group consisting of non-polar or weakly polar organic liquid monomers and a functionalized protonic acid solute and a suitable fraction of one or more other polymers (for example polyethylene, polypropylene, polystyrene, elastomers, poly(ethylvinylacetate), polyvinylchloride, etc.) ; and b. polymerizing the monomer in said solution or plasticized composition.

Yet another aspect of this invention relates to methods of forming a conductive article which is a composite, or polyblend of conductive polyaniline with other polymers (for example polyethylene, polypropylene, polystyrene, elastomers, poly(ethylvinylacetate), polyvinylchloride, etc.) from the solution or plasticized composition of this invention which compromises the steps of:

a. forming a solution or plasticized composition comprising polyaniline, a functionalized protonic acid solute and a suitable fraction of one or more molten or liquidified polymers selected from the group consisting of nonpolar or weakly polar thermoplastic polymers; and b. solidifying said solution or plasticized composition.

Any of these processes can additionally contain the step of drawing or otherwise distorting the shape of the article to improve its physical and electrical properties.

Still another aspect of this invention relates to conductive articles made from polyaniline or from composites or polyblends of polyaniline with one or more other polymers (for example polyethylene, polypropylene, polystyrene, elastomers, poly(ethylvinylacetate), polyvinylchloride, etc.) prepared in accordance with the method of this invention.

Use of the solution or plasticized composition of this invention in the method of this invention provides conductive articles made from polyaniline or from composites or polyblends of polyaniline with one or more other polymers (for example polyethylene, polypropylene, polystyrene, elastomers, poly(ethylvinylacetate), polyvinylchloride, etc.) of all shapes, as for example, articles fabricated by injection molding or bulk extrusion, or articles fabricated by use of the methods of solution processing (for example flexible films, tapes, or fibers), on substrates or free-standing, all of which are stable.

DETAILED DESCRIPTION OF THE INVENTION

Figure 1:
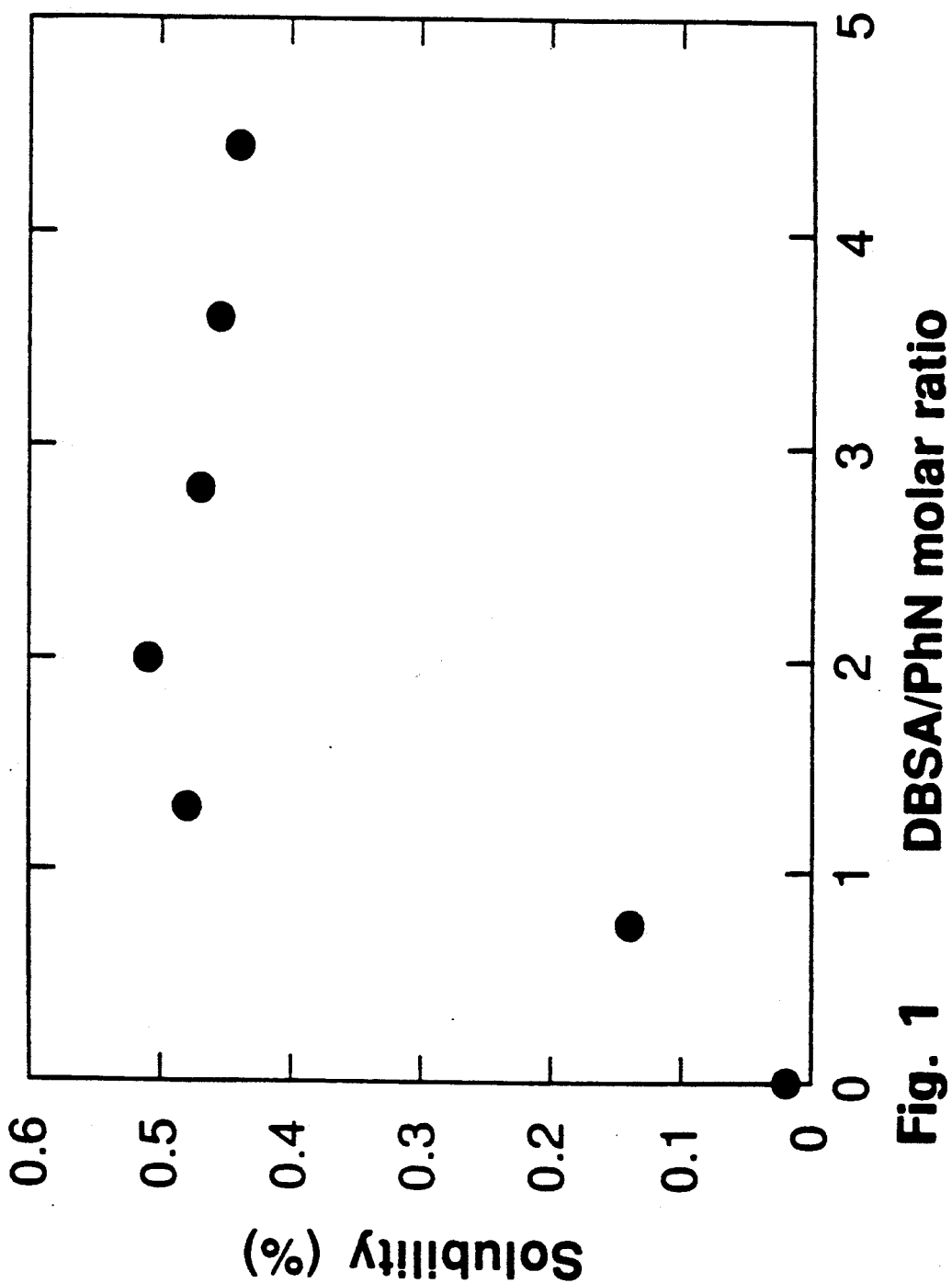
FIG. 1 is a graph which shows the concentration in solution of a conducting polyaniline-dodecylbenzesulfonic acid (DBSA) protonic acid complex in xylene as a function of the molar ratio of the total amount of DBSA to aniline repeat unit.

The solution or plasticized composition of this invention typically includes three ingredients.

(i) A substituted or unsubstituted polyaniline;

(ii) A functionalized protonic acid solute in which the counterior has been functionalized to be compatible with nonpolar or weakly polar organic liquids;

(iii) A nonpolar or weakly polar organic fluid phase. This fluid phase can be an organic liquid. It can also be an organic semisolid such as melted or softened polymer, or in a special circumstance can be the protonic acid when it is a liquid and not overly polar in overall character—i.e., when it has a large nonpolar region.

The Polyaniline

One ingredient is a substituted or unsubstituted polyaniline. In general, polyanilines for use in the invention are polymers and copolymers of film and fiber forming molecular weight derived from the polymerization of unsubstituted and substituted anilines of the Formula 1:

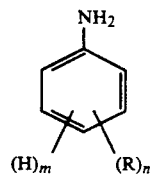

Formula I wherein n is an integer from 0 to 4;

m is an integer from 1 to 5 with the proviso that the sum of n and m is equal to 5; and R is independently selected so as to be the same or different at each occurrence and is selected from the group consisting of alkyl, alkenyl, alkoxy, cycloalkyl, cycloalkenyl, alkanoyl, alkythio, aryloxy, alkylthioalkyl, alkylaryl, arylalkyl, amino, alkylamino, dialkylamino, aryl, alkylsulfinyl, alkoxyalkyl, alkylsulfonyl, arylthio, arylsulfinyl, alkoxycarbonyl, arylsulfonyl, carboxylic acid, halogen, cyano, or alkyl substituted with one or more sulfonic aid, carboxylic acid, halo, nitro, cyano or expoly moieties; or carboxylic acid, halogen, nitro, cyano, or sulfonic acid moieties; or any two R groups together may form an alkylene or alkyenylene chain completing a 3, 4, 5, 6 or 7 membered aromatic or alicyclic ring, which ring may optionally include one or more divalent nitrogen, sulfur or oxygen atoms. Without intending to limit the scope of this invention, the size of the various R groups ranges from about 1 carbon (in the case of alkyl) through 2 or more carbons up through about 20 carbons with the total of n Rs being from about 1 to about 40 carbons.

Illustrative of the polyanilines useful in the practice of this invention are those of the Formula II to V:

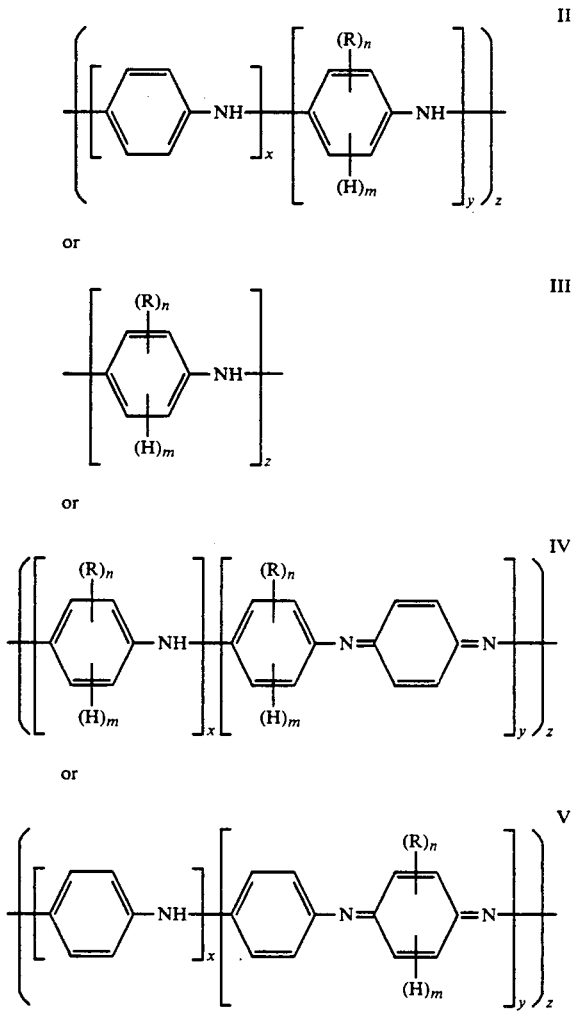

wherein:
n, m and R are as described above except that m is reduced by 1 as a hydrogen is replaced with a covalent bond in the polymerization,
y is an integer equal to or greater than 0;
x is an integer equal to or greater than 1, with the proviso that the sum of x and y is greater than 1; and
z is an integer equal to or greater than 1.

The following listing of substituted and unsubstituted anilines are illustrative of those which can be used to prepare polymers and copolymers useful in the practice of this invention.

| Anilines | 2,5-Dimethylaniline |
|---|---|
| o-Toluidine | 2,3-Dimethylaniline |
| m-Toluidine | 2,5-Dibutylaniline |
| o-Ethylaniline | 2,5-Dimethoxyaniline |
| m-Ethylaniline | Tetrahydronaphthylamine |
| o-Ethoxyaniline | o-Cyanoaniline |
| m-Butylaniline | 2-Thiomethylaniline |
| m-Hexylaniline | 2,5-Dichloroaniline |
| m-Octylaniline | 3-(n-Butanesulfonic acid) aniline |
| 4-Bromoaniline | |
| 2-Bromoaniline | |
| 3-Bromoaniline | 2,4-Dimethoxyaniline |
| 3-Acetamidoaniline | 4-Mercaptoaniline |
| 4-Acetamidoaniline | 4-Methylthioaniline |
| 5-Chloro-2-methoxyaniline | 3-Phenoxyaniline |
| 5-Chloro-2-ethoxyaniline | 4-Phenoxyaniline |

Illustrative of useful R groups are alkyl, such as methyl, ethyl, octyl, nonyl, tert-butyl, neopentyl, isopropyl, sec-butyl, dodecyl and the like, alkenyl such as 1-propenyl, 1-butenyl, 1-pentenyl, 1-hexenyl, 1-heptenyl, 1-octenyl and the like; alkoxy such as propoxy, butoxy, methoxy, isopropoxy, pentoxy, nonoxy, ethyoxy, octoxy, and the like, cycloalkenyl such as cyclohexenyl, cyclopentenyl and the like; alkanoyl such as butanoyl, pentanoyl, octanoyl, ethanoyl, propanoyl and the like; alkylsulfinyl, alkysulfonyl, alkylthio, arylsulfonyl, arylsulfinyl, and the like, such as butylthio, neopentylthio, methylsulfinyl, benzylsulfinyl, phenylsulfinyl, propylthio, octylthio, nonylsulfonyl, octylsulfonyl, methylthio, isopropylthio, phenylsulfonyl, methylsulfonyl, nonylthio, phenylthio, ethylthio, benzylthio, phenethylthio, naphthylthio and the like; alkoxycarbonyl such as methoxycarbonyl, ethoxycarbonyl, butoxycarbonyl and the like, cycloalkyl such as cyclohexyl, cyclopentyl, cyclooctyl, cycloheptyl and the like; alkoxyalkyl such as methoxymethyl, ethoxymethyl, butoxymethyl, propoxyethyl, pentoxybutyl and the like; aryloxyalkyl and aryloxyaryl such as phenoxyphenyl, phenoxymethylene and the like; and various substituted alkyl and aryl groups such as 1-hydroxybutyl, 1-aminobutyl, 1-hydroxylpropyl, 1-hydyroxypentyl, 1-hydroxyoctyl, 1-hydroxyethyl, 2-nitroethyl, trifluoromethyl, 3,4-epoxybutyl, cyanomethyl, 3-chloropropyl, 4-nitrophenyl, 3-cyanophenyl, and the like; sulfonic acid terminated alkyl and aryl groups and carboxylic acid terminated alkyl and aryl groups such as ethylsulfonic acid, propylsulfonic acid, butylsulfonic acid, phenylsulfonic acid, and the corresponding carboxylic acids.

Also illustrative of useful R groups are divalent moieties formed from any two R groups such as moieties of the formula:

$$-(CH_2)-_n$$

wherein n is an integer from about 3 to about 7, as for example $-(CH_2)-_4$, $-(CH_2)-_3$ and $-(CH_2)-_5$, or such moieties which optionally include heteroatoms of oxygen and sulfur such as $-CH_2SCH_2-$ and $-CH_2-O-CH_2-$. Exemplary of other useful R groups are divalent alkenylene chains including 1 to about 3 conjugated double bond unsaturation such as divalent 1,3-butadiene and like moieties.

Preferred for use in the practice of this invention are polyanilines of the above Formulas II to V in which:
n is an integer from 0 to about 2;
m is an integer from 2 to 4, with the proviso that the sum of n and m is equal to 4;
R is alkyl or alkoxy having from 1 to about 12 carbon atoms, cyano, halogen, or alkyl substituted with carboxylic acid or sulfonic acid substituents;
x is an integer equal to or greater than 1;
y is an integer equal to or greater than 0;
with the proviso that the sum of x and y is greater than about 4, and
z is an integer equal to or greater than about 5.

Particularly preferred for use in the practice of this invention are polyanilines of the above Formulas II to V in which:

n is an integer from 0 to 2;

m is an integer from 2 to 4, with the proviso that the sum of n and m is equal to 4;

R is alkyl or alkoxy having from 1 to about 4 carbon atoms or alkyl substituted with carboxylic acid or sulfonic acid substituents;

x is an integer equal to or greater than 1;

y is an integer equal to or greater than 0, with the proviso that the sum of x and y is greater than about 6; and z is an integer equal to or greater than about 10.

Amongst the particularly preferred embodiments, most preferred for use in the practice of this invention are polyanilines of the above Formulas II to V in which:

n is an integer from 0 to 1;

m is an integer from 3 to 4, with the proviso that the sum of n and m is equal to 4;

R is alkyl or alkoxyl from 1 to about 4 carbon atoms;

x is an integer equal to or greater than 2;

y is an integer equal to or greater than 1, with the proviso that the sum of x and y is greater than about 8; and z is an integer equal to or greater than about 15.

In the most preferred embodiments of this invention, the polyaniline is derived from unsubstituted aniline, i.e., where n is 0 and m is 5 (monomer) or 4 (polymer).

In general, the polyanilines particularly useful in the practice of this invention are those which are of "film and fiber forming molecular weight." As used herein, "film and fiber forming molecular weight" generally means number average molecular weights which exceed about 10,000 daltons. Solutions of such soluble polymers generally can be cast to form thin, freestanding films or extruded into films and fibers which are coherent and retain their shape, and preferably are not brittle when bent.

In general, an advantage of this invention is that substituted and unsubstituted polyanilines in the protonated conducting form may be dissolved in organic liquids and such polyanilines have more than 8 monomer repeat units as for example those polyanilines described in U.S. Pat. Nos. 3,963,498 and 4,025,463. Because of the higher molecular weight, these substituted and unsubstituted polyanilines can be coated onto substrates and spun into fibers without the need for binders, i.e., polymer compositions which bind and improve the stability of the polyanilines which is not generally true of the low molecular weight oligomeric polyanilines described in U.S. Pat. Nos. 3,963,498 and 4,025,463. The molecular weight of the substituted or unsubstituted polyaniline at which the polymer will be film or fiber forming may vary widely, depending on a number of factors including the number of repeat units, and the number of substituents and the substituent pattern. In general, substituted and unsubstituted polyanilines will be of film and fiber forming molecular weight where the number of monomer repeat units is at least about 50. In the preferred embodiments of the invention, the number of repeat units is at least about 75, and in the particularly preferred embodiments, the number of repeat units is at least about 200. Amongst the particularly preferred embodiments, most preferred are those embodiments in which the number of repeat units is at least about 250.

Any form of substituted and unsubstituted polyaniline can be conveniently used in the practice of this invention. Illustrative of useful forms are those described in Green, A. G., and Woodhead, A. E., "Aniline-black and Allied Compounds, Part i," *J. Chem. Soc.. Vol.* 101, pp. 1117 (1912) and Kobayashi, et al., "Electrochemical Reactions . . . of Polyaniline Film-Coated Electrodes," *J. Electroanl. Chem.*, Vol. 177, pp. 281-91 (1984), which is hereby incorporated by reference. For example, unsubstituted polyaniline, useful forms include leucoemeraldine, protoemeraldine, emeraldine, nigranilline and tolu-protoemeraldine forms.

Useful polyanilines can be prepared through use of chemical and electrochemical synthetic procedures. For example, one form of polyaniline having at least about 160 repeat units can be prepared by treating aniline with ammonium persulfate $(NH_4)_2S_2O_8$ in excess 1M HCl. This powdered form of polyaniline is blue green in color. After methanol washing and air drying this material exhibited a conductivity of 10 S-cm$^{-1}$. This conductive form of polyaniline can be treated with ammonium hydroxide in ethanol to form a non-conductive form of polyaniline which is purple in color and which has a conductivity of less than $10^{-8}$ S-cm$^{-1}$. Other chemical procedures for preparation of various chemical forms of polyaniline are described in detail in Green et al. described above.

Useful forms of polyaniline can also be prepared electrochemically. For example, useful forms of polyaniline can be prepared by the electrochemical oxidation of aniline in aqueous fluoroboric acid electrolyte on a platinum foil anode.

Other chemical and electrochemical syntheses and transformations of the conductive form of polyaniline may be discovered and are presently contemplated as being useful. Moreover, additional forms or types of polyaniline may be elucidated in the future. Accordingly, no limitation to the syntheses, transformation, or structures herein described or postulated is intended beyond the limitations of the appended claims.

The Functionalized Protonic Acid

The second ingredient of the solution or plasticized composition of this invention is a "functionalized protonic acid solute" in which the counter-ion has been functionalized to be compatible with nonpolar organic solvents. As used herein a "protonic acid solute" is an acid that protonates the substituted or unsubstituted polyaniline to form a complex with said polyaniline, which complex has a conductivity equal to or greater than about $10^{-3}$ S-cm$^{-1}$. Protonic acids are well known in the conductive polymer art, but are not necessarily miscible with nonpolar or weakly polar organic liquids. As used herein a "functionalized" protonic acid solute is an acid that protonates the substituted or unsubstituted polyaniline to form a complex with said polyaniline, which complex has a conductivity equal to or greater than about $10^{-3}$ S-cm$^{-1}$ and which has been functionalized to act as a surfactant and thereby to be compatible with nonpolar or weakly polar organic liquids. In general, functionalized protonic acids for use in the invention are those of Formulas VI and VII:

$$A-R_1 \quad \quad \quad VI$$

or

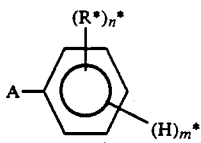

VII wherein:

A is sulfonic acid, selenic acid, phosphonic acid or a carboxylic acid group; or hydrogen sulfate, hydrogen selenate, hydrogen phosphate;

n is an integer from 0 to 5;

m is an integer from 0 to 4 with the proviso that the sum of n and m is 5;

$R_1$ is alkyl, alkenyl, alkoxy, alkanoyl, alkylthio, alkylthioalkyl, having from 1 to about 20 carbon atoms; or alkylaryl, arylalkyl, alkylsulfinyl, alkoxyalkyl, alkylsulfonyl, alkoxycarbonyl, carboxylic acid, where the alkyl or alkoxy has from 0 to about 20 carbon atoms; or alkyl having from 3 to about 20 carbon atoms substituted with one or more sulfonic acid, carboxylic acid, halogen, nitro, cyano, diazo, or epoxy moieties; or a substituted or unsubstituted 3, 4, 5, 6 or 7 membered aromatic or alicyclic carbon ring, which ring may include one or more divalent heteroatoms of nitrogen, sulfur, sulfinyl, sulfonyl or oxygen such as thiophenyl, pyrolyl, furanyl, pyridinyl.

In addition to these monomeric acid forms, $R_1$ can be a polymeric backbone from which depend a plurality of acid functions "A." Examples of polymeric acids include sulfonated polystyrene, sulfonated polyethylene and the like. In these cases the polymer backbone should be selected to be soluble in the nonpolar organic solvent (plasticizer) such that highly polar polymers, for example polyacrylic acid or poly(vinylsulfonate) or the like, are usually not preferred.

$R^*$ is the same or different at each occurrence and is alkyl, alkenyl, alkoxy, cycloalkyl, cycloalkenyl, alkanoyl, alkylthio, aryloxy, alkylthioalkyl, alkylaryl, arylalkyl, alkylsulfinyl, alkoxyalkyl, alkylsulfonyl, aryl, arylthio, arylsulfinyl, alkoxycarbonyl, arylsulfonyl, carboxylic acid, halogen, cyano, or alkyl substituted with one or more sulfonic acid, carboxylic acid, halogen, nitro, cyano, diazo or epoxy moieties; or any two R substituents taken together are an alkylene or alkenylene group completing a 3, 4, 5, 6 or 7 membered aromatic or alicyclic carbon ring or multiples thereof, which ring or rings may include one or more divalent heteroatoms of nitrogen, sulfur, sulfinyl, sulfonyl or oxygen. $R^*$ typically has from about 1 to about 20 carbons especially 3 to 20 and more especially from about 8 to 20 carbons. It will be appreciated that the depiction of the acids as $A—R_1$ is equivalent to their earlier depiction as $H^+(M^-—R_p)$ and that the

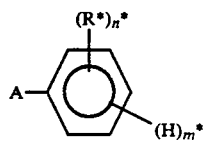

acids fall within the general structure of $A—R_1$.

Preferred for use in the practice of this invention are functionalized protonic acid solutes of the above Formulas VI and VII in which:

A is sulfonic acid, phosphonic acid or carboxylic acid;

$n^*$ is an integer from 1 to 5;

$m^*$ is an integer from 0 to 4 with the proviso that the sum of n and m is 5;

$R_1$ is alkyl, alkenyl, alkoxy, alkanoyl, alkylthio, alkylthioalkyl, having from 5 to about 16 carbon atoms; or alkylaryl, arylalkyl, alkylsulfinyl, alkoxyalkyl, alkylsulfonyl, alkoxycarbonyl, carboxylic acid, where the alkyl or alkoxy has from 1 to about 20 carbon atoms; or alkyl having from 3 to about 20 carbon atoms substituted with one or more sulfonic acid, carboxylic acid, halogen, nitro, cyano diazo, or epoxy moieties;

$R^*$ is the same or different at each occurrence and is alkyl, alkenyl, alkoxy, arylalkyl, alkylsulfonyl, alkoxycarbonyl or carboxylic acid having from 3 to 12 carbon atoms, or alkyl substituted with one or more carboxylic acid, halogen, diazo or epoxy moieties;

Particularly preferred for use in the practice of this invention are functionalized protonic acid solutes of the above Formulas VI and VII in which:

A is sulfonic acid or carboxylic acid;

$n^*$ is an integer from 1 to 3;

$m^*$ is an integer from 0 to 4 with the proviso that the sum of n and m is 5;

$R_1$ is alkyl, alkenyl, alkoxy, having from 6 to about 14 carbon atoms; or arylalkyl, where the alkyl or alkyl portion or alkoxy has from 4 to about 14 carbon atoms; or alkyl having from 6 to about 14 carbon atoms substituted with one or more, carboxylic acid, halogen, diazo, or epoxy moieties;

$R^*$ is the same or different at each occurrence and is alkyl, alkoxy, alkylsulfonyl, having from 4 to 14 carbon atoms, or alkyl substituted with one or more halogen moieties again with from 4 to 14 carbons in the alkyl.

Among the particularly preferred embodiments, most preferred for use in the practice of this invention are functionalized protonic acid solutes of the above Formulas VI and VII in which:

A is sulfonic acid;

$n^*$ is the integer 1 or 2;

$m^*$ is the integer 3 or 4 with the proviso that the sum of n and m is 5;

$R^1$ is alkyl or alkoxy, having from 6 to about 14 carbon atoms; or alkyl having from 6 to about 14 carbon atoms substituted with one or more halogen moieties;

$R^*$ is alkyl or alkoxy, having from 4 to 14, especially 12 carbon atoms, or alkyl substituted with one or more halogen, moieties.

In the most preferred embodiments of this invention, the functionalized protonic acid solute is dodecylbenzene sulfonic acid.

The amount of functionalized protonic acid employed can vary depending on the degree of conductivity and solubility required and whether a solution or plasticized composition is desired. In general, sufficient functionalized protonic acid is added to the polymer (in solution or in solid form of a plasticized composition) to form a conducting polymer (either in the form of plasticized composition or in solution) which is soluble in the desired organic liquids described below, or which is plasticized by such liquids. Usually the amount of functionalized protonic acid employed is at least sufficient to give a conductive polymer (either in solution or in solid form) having a conductivity of at least about $10^{-6}$ S-cm$^{-1}$. The upper level of conductivity is not critical and will usually depend on the type of aniline polymer employed. In general, the highest level of conductivity obtained is provided without unduly adversely affecting the environmental stability of the polymer. In the preferred embodiments of the invention the amount of functionalized protonic acid employed is sufficient to provide a conductivity of at least about $10^{-4}$ S-cm$^{-1}$, and in the particularly preferred embodiments is sufficient to provide a conductivity of at least about $10^{-2}$ S-cm$^{-1}$. Amongst these particularly preferred embodiments, most preferred are those embodiments in which unsubstituted polyaniline is employed and in which a sufficient amount of acid is employed to provide a conductivity of at least about $10^{-1}$ S-cm$^{-1}$.

The amount of functionalized protonic acid plays a part in determining whether a plasticized composition or a solution is formed. In general, the higher the degree of protonation (with associated functionalized counterion), the greater the solvency of the protonated conducting polymer in the solvent. Conversely, the lower the degree of protonation and the lower the concentration of functionalized counterion), the less the solvency of the conducting polymer in the solvent, but the polymer is still plasticizable. For example, as shown in Example 3, in the case of the most preferred unsubstituted polyaniline where the level of protonation is about 1.0 or more equivalents of functionalized protonic acid per aniline repeat unit, soluble conductive polyaniline is provided. However, where the level of protonation is less than about 1 equivalent of protonic acid per aniline repeat unit, plasticizable conductive polymers are formed. As noted above, sufficient protonation occurs to form either the soluble conductive polymer or plasticized conductive polymer. In a preferred embodiment of this invention, the level of protonic acid addition is such that solutions of conductive polymers are obtained.

The Solvent

A third component of the solution or plasticized composition of this invention is a nonpolar or weakly polar organic solvent, or oligomeric or polymeric liquid. As used herein the terms "nonpolar or weakly polar organic solvent, or oligomeric or polymer liquid" and the like refer to a liquid or fluid semisolid which has a dielectric constant at room temperature of equal to or less than about 22. Preferred of these solvents are those common organic solvents, or oligomers or polymer liquids with dielectric constants equal to or less than about 15. Especially preferred solvents are those solvents, or oligomers or polymer liquids with dielectric constants equal to or less than about 10. Illustrative of useful common solvents are the following materials which are liquids at ambient temperature: substituted or unsubstituted aromatic hydrocarbons such as benzene, toluene, p-xylene, m-xylene, naphthalene, ethylbenzene, styrene, aniline and the like; higher alkanes such as pentane, hexane, heptane, octane, nonane, decane and the like; cyclic alkanes such as decahydronaphthalene; halogenated alkanes such as chloroform, bromoform, dichloromethane and the like; halogenated aromatic hydrocarbons such as chlorobenzene, o-dichlorobenzene, m-dichlorobenzene, p-dichlorobenzene and the like; higher alcohols such as 2-butanol, 1-butanol, hexanol, pentanol, decanol, 2-methyl-1-propanol and the like; higher ketones such as hexanone, butanone, pentanone and the like; heterocyclics such as morpholine; perfluorinated hydrocarbons such as perfluorodecaline, perfluorobenzene and the like. Mixtures of such organic solvents can also be used as for example mixtures of xylene and chlorobenzene.

Other useful solvents include liquidified or molten oligomers or polymers which can serve as solvents or plasticizers in the present invention. Illustrative of useful oligomeric liquids are molten or liquidified higher alkanes such as hexatriacontane, dotriadecane, octadodecane; branched higher alkanes and waxes, and perfluorinated higher alkanes and waxes. Illustrative of useful polymeric liquids are molten or liquidified polyethylenes, isotactic polypropylene, polystyrene, poly(vinylalcohol), poly(ethylvinylacetate), polybutadienes, polyisoprenes, ethylenevinylenecopolymers, ethylenepropylene copolymers, poly(ethyleneterephthalate), poly(butyleneterephthalate) and nylons such as nylon 12, nylon 8, nylon 6, nylon 6.6 and the like.

Organic liquids selected for use in any particular situation will depend primarily on the various R substituents of the polyaniline, and/or of the functionalized protonic acid, and/or one or more other polymers that are selected to form a soluble or plastized blend with the substituted or unsubstituted polyaniline. In general, less polar substituents and/or less polar other polymers used the preparation of polyblends, will require lower dielectric constants. Conversely, more polar substituents and/or more polar other polymers used the preparation of composites or polyblends, will require higher dielectric constants.

Preferred common organic solvents are toluene, xylenes, styrene, aniline, decahydronaphthalene, chloroform, dichloromethane, chlorobenzenes, morpholine, and particularly preferred solvents are toluene, xylenes, decahydronaphthalene, and chloroform. Amongst these particularly preferred embodiments, most preferred are those embodiments in which the solvents are aromatic hydrocarbons such as xylene, and halogenated hydrocarbons such as chloroform. Preferred oligomers and polymeric liquids are molten or liquidified branched higher alkanes and waxes; and molten or liquidified polyethylenes, isotactic polypropylene, polystyrene, poly(vinylalcohol), poly(ethylvinylacetate), polybutadienes, poly(ethyleneterephthalate), poly(butyleneterephthalate), nylons such as nylon 12, nylon 6 and nylon 6.6. Amongst these particularly preferred embodiments, most preferred are those embodiments in which the oligomers and polymeric liquids are molten or liquidified waxes; and molten or liquidified polyethylenes, isotactic polypropylene, polybutadienes, poly(ethyleneterephthalate), nylon 12, nylon 6 and nylon 6.6.

Overall Proportions

The proportions of materials are not critical and can vary widely. However, the following guidelines are believed important for achieving materials particularly useful in the present invention. In general, the amount of solvent or plasticizer as a proportion of the amount of solution is not believed to be critical, since any amount as a liquid or semisolid will form at least a viscous gel with the protonated conductive polymers. These viscous embodiments of the invention are particularly useful for silkscreening conductive circuitry and for applying thick film coating on substrates. For other applications, it may be preferred, however, to use sufficient liquid solvent to lower the viscosity of the gel or solution to a point where it flows at least sufficiently to conform to a container shape or mold in a reasonably short period of time, e.g., in 30 minutes or less; or the be extruded into films and fibers. Preferably, the liquid is present in sufficient amounts to lower the viscosity of the solution to less than about 10,000 centipoise, and more preferably from about 1 to about 1,000 centipoise.

As just described the conductive polymer compositions of this invention include polyaniline, protonic acid, and solvent or plasticizer (which can be protonic acid in some cases as already noted). The relative proportions of these materials can range as follows.

| Polyaniline | 1 part by weight. |
|---|---|
| Protonic acid | At least 1 protonic acid proton for each 10 repeat units of aniline, preferably at least one for each 8 repeat units - typically from 0.01 parts to 5 parts by weight. |
| Solvent or plasticizer (including excess acid) | 0.1 parts to 200 parts, especially 0.2 to 100 parts. |

In addition to the polyaniline homopolymer or copolymer, functionalized protonic acid and liquid, the solutions and plasticized compositions of this invention can include other optional ingredients which either dissolve or do not dissolve in the solution. The nature of such optional ingredients can vary widely, and include those materials which are known to those of skill in the art for inclusion in polymer articles. In the case of dissolvable components, materials may be present which alter the physical or mechanical properties of either the solution or the articles eventually derived from the solution. Examples of such materials include other conventional polymers such as polycarbonate, polyacrylonitrile, polyvinyl chloride, polyvinylidine chloride, polyvinyl alcohol, polyethylene oxide, polystyrene, nylon, cellulose acetate butyrate, polypropylene, polyethylene, polypropylene cellulose acetate, polyphenylene oxides and the like. In the case of non-soluble fourth components, materials may be present which either fill or form a substrate for the conductive polymer cast from the solution. These fourth components include other conductive polymers, other polymers such as poly(3-alkylthiophenes) which may become conductive upon doping, graphite, metal conductors, reinforcing fibers and inert fillers (such as clays and glass). These other polymers can be present in as much as 98% of the total mixture, and being optional can be omitted altogether. Usually, for commercially attractive products these added polymers make up 2% to 95% by weight of the total final product.

The method of forming the solutions or plasticized compositions of this invention is not critical and can vary widely. For example, one method of forming the present solution containing the protonated aniline polymer and the functionalized counter-ions is to react, simultaneously, the aniline polymer, the functionalized protonic acid and the solvent or plasticizer as a liquid. Thus, for example, by introducing polyaniline as a solid powder, xylene as a liquid and dodecylbenzene sulfonic acid (DBSA) as a liquid into a mixing vessel, a solution of the protonated conductive polymer is formed, from which conductive polymer can be cast. The conditions of such mixing are not critical, provided that sufficient DBSA is used to dope the desired quantity of polymer and sufficient solvent is employed to reduce the viscosity of the solution to manageable levels. An alternate technique of preparing the solution of this invention containing the protonated conductive polymer is to mix first the polymer and the solvent, thereafter add the functionalized protonic acid to the solution or two phase system. Thus, for example, if polyaniline powder is admixed with xylene solvent, the powder will remain suspended in the solvent for extended periods under normal conditions. The addition of a functionalized protonic acid to this suspension, such as DBSA, causes the powder to be protonated and, thereafter, causes the protonated conductive polymer to go into solution. In another preferred method the solid polymer powder is first mixed with the functionalized protonic acid, such as DBSA, which causes the polymer to be protonated. Subsequently, the protonated polymer is admixed with, for example, xylene and a solution is formed. Another preferred method for the preparation of solutions containing the polyaniline homopolymer or copolymer and the functionalized protonic acid is where the polymer is synthesized directly in the presence of the functionalized protonic acid and in the non-polar or weakly polar solvent or plasticizing liquid, as described in Example B. This method is of special interest because the functionalized protonic acid acts as a surfactant in this emulsion polymerization, and yields high molecular weights of the polymers, and high conductivities of the resulting materials derived from the emulsions.

After forming the products or forms, including the conductive polymers of this invention, one can often enhance their physical or electrical properties by drawing or otherwise distorting them. This process and guidelines to its successful use are set out in the Examples.

Various methods are contemplated for using the solution or plasticized composition of the present invention. The solvent can be removed from the solution through use of any conventional solvent removal method but is removed preferably by evaporation. Alternatively, the solvent and unreacted functionalized protonic acid can be removed by extraction with an extractant in which the solvent and unreacted functionalized protonic acid are substantially more soluble than the doped polymer. If liquidified or molten oligomers or polymers are used as the solvent or plasticizing liquid, solid conducting articles can be formed simply by cooling the liquid composition, as is commonly performed in injection molding, melt extrusion, etc. Alternatively, when polymerizable monomers are employed as the solvent or plasticizing liquid, solid conducting articles can be formed by affecting polymerization of the monomer. In the two latter methods removal of the solvent or plasticizing liquid is not required.

As will be appreciated by those skilled in polymer processing, the ability to form shaped polymer articles by removing a solvent from a solution enables one to prepare articles of a wide variety of shapes and sizes. Thus, for example, by removing volatiles from the present solution or plasticized composition spread on a surface, films of any desired thickness can be prepared. Extremely thin films can be prepared which are substantially transparent. By extruding the solution or plasticized composition through a die, fibers or films can be made. Similarly, by removing volatiles from the solution or plasticized composition in a mold of various shapes, shaped articles conforming in shape to the mold can be prepared. It will be appreciated that some shrinkage might occur between the solution in its last flowable state to the final article, but such shrinkage is conventionally accounted for in molding polymers from solution. It is also contemplated that, once a solution or plasticized composition is formed, a partial or substantial removal of solvent will occur prior to placing the solution or plasticized composition on a surface or in a mold, with the final venting of a solvent occurring on the surface or in the mold. It is contemplated that, if fourth or additional soluble components are introduced into the solution, they will, unless also volatile, be present in the shaped article formed. If the fourth component is a non-volatile liquid, then the removal of volatile components may leave a new liquid or plasticized form of protonated conducting polymer or undoped-neutral polymer. If the additional components are volatile, then foamed or expanded cellular forms of the polymer may be formed.

In the event that fourth or additional nonsoluble components are present (or suspended) in the solution, the protonated conductive polymer will form around, or be filled with, the insoluble material. If, for example, the additional components are glass fibers, the relative amounts of fibers and protonated conductive polymer remaining will cause either the polymer to be fiber-filled, the fibers to be polymer coated or impregnated, or some intermediate composite of fibers and protonated conductive polymer to be formed. In the case of systems wherein the amount of non-soluble component greatly exceeds the protonated conductive polymer remaining, individual particles or shapes of non-soluble components coated or impregnated with protonated conductive polymer will be formed. Examples of articles formed from nonsoluble components and the present polymer solutions include conductive polymer coated housings for sensitive electronic equipment (microprocessors), infrared and microwave absorbing shields, flexible electrical conducting connectors, conductive bearings, brushes and semi-conducting photoconductor junctions, antistatic materials for packaging electronic components, carpet fibers, waxes for floors in computer rooms and an antistatic spray finisher for plastics, and thin, optically transparent antistatic finishes for CRT screens, aircraft, auto windows and the like.

It is also contemplated to use the present solutions or plasticized compositions as such as either liquid conductors or liquid semiconductors, much in the manner that liquid mercury is used in various devices. Examples of such devices include gravity switches, fluid level detecting devices or other electrical or electronic switches. Such use is based upon the conductivity of the solution, which the case of polyaniline protonated with DBSA in xylene can represent a relatively high electrical conductivity (from about $10^{-3}$ S-cm$^{-1}$ to about $10^{-1}$ S-cm$^{-1}$) which appears to b.e predominantly of an electronic rather than ionic nature.

The following specific examples are present to illustrate the invention and are not to be construed as limitations thereon.

EXAMPLE A

Polyaniline was prepared according to the method described by Y. Cao, A. Andereatta, A. J. Heeger and P. Smith, *Polymer*, 30 (1989) 2305: A solution of 40 ml of freshly distilled aniline (Aldrich), 50 ml of 35% HCl (Fisher) and 400 ml distilled water was prepared in an 1L Erlenmeyer flask. The flask was placed in a cooling bath maintained at 0° C. Polymerization was effected by addition of an oxidant solution consisting of 46 g of $(NH_4)_2S_2O_8$ (Aldrich) and 100 ml of distilled water. After all oxidant was added (2 hr), the flask was capped and left stirring for an additional 3 hours. The precipitated polymer powder was recovered, filtered and washed with distilled water until the pH of washing liquid was 6–7. Subsequently, the polymer was washed with methanol until the liquid was clear, and then with ethyl ether to eliminate residual water and methanol. Finally, the polymer was dried in a vacuum at room temperature for 48 hours. Emeraldine base form of polyaniline was prepared by compensation of the polyaniline salt. Ten (10) g of polyaniline salt was stirred with 1000 ml of 3% NH$_4$OH solution during 2 hours at room temperature. The resulting emeraldine base was filtrated and washed by distilled water until the pH of washing liquid was 7–8. Subsequently, the polymer was washed by methanol until washing liquid was colorless and then, with methyl ether. The emeraldine base was dried in dynamic vacuum at room temperature for 48 hours. The resulting polymer was insoluble in all common non-polar or weakly polar solvents, and of high molecular weight; the inherent viscosity of the nonconducting polyaniline measured at 25° C. in 97% sulfuric acid, 0.1% w/w, was 1.2 dL/g.

EXAMPLE 1

The nonconductive form of polyaniline as prepared in Example A, 5.43 g (0.06 M of PhN), was mixed thoroughly with 9.79 g (0.03 M) of p-dodecylbenzene sulfonic acid (DBSA) (Tokyo Kasei) using an agate mortar and pestle in a dry bag filled with nitrogen. The molar ratio of DBSA to PhN repeat unit was 0.5; sufficient to completely protonate the emeraldine base form into the conducting salt form.

EXAMPLE 2

The material of Example 1, 0.1 g was mixed with 0.1 g of DBSA. The mixture was placed into 20 g of xylene; and treated in an ultrasonic bath for 48 hours and subsequently centrifuged. Most of the polyaniline-DBSA complex dissolved to give a deep green solution. Some insoluble solids were removed by decanting.

EXAMPLE 3

The solution of Example 2 was evaporated to yield a solid, which was washed with acetone to remove excess DBSA. The polyaniline-DBSA complex thus obtained was weighed to calculate the content of the conductive polyaniline complex in said solution. Then, Example 2 was repeated but with the additional amount of DBSA varied over the following values: 0 (which is the reference material of Example 1), 0.05, 0.2, 0.3, 0.4, 0.5 g. The concentration of the conducting polyaniline-DBSA complex in said solutions was determined; and plotted against the molar ratio of the total amount of DBSA to PhN in the solution is shown in FIG. 1. These results illustrate that, in order to obtain a soluble conductive polyaniline-DBSA, more than 0.5 equivalents of functionalized protonic acid per aniline repeat unit is necessary. Less than this amount results in a doped, conductive, plasticizable form of the polymer.

EXAMPLE 4

The material from Example 1 was mixed, in 1 g quantity, with 1 g of additional DBSA to give a molar DBSA/PhN ratio of 1.3. The solubility of the resulting mixture was tested in several different solvents; 0.1 gram of the mixture was placed in 10 g of the various solvents and stirred at room temperature for 1 hr. The results are shown in Table 1.

TABLE 1

Solubility of Polyaniline-DBSA (DBSA/PhN = 1.3) in Selected Solvents

| Solvent | Soluble | Dielectric Constant (Room Temperature) |
|---|---|---|
| Toluene | yes | 2.4 |
| 1,2,4-Trichlorobenzene | yes | 5 |
| Chloroform | yes | 4.8 |
| Decalin | yes | 2.2 |
| Xylenes | yes | 2.2.-2.6 |
| Dimethylsufoxide | no | 46.7 |
| Dimethylacetamid | no | 37.8 |
| Dimethylformamide | no | 36.7 |
| Formic acid | no | 58 |

*above ~80° C.

Similar results were obtained by repeating the above experiments in Examples 1 and 4 with hexanesulfonic acid and octanesulfonic acid in place of DBSA.

EXAMPLE 5

A solution was prepared as in Example 2 and was cast onto a glass plate. The xylene was evaporated, and the resulting film was washed with acetone to remove excess DBSA. The remaining film was dried at room temperature and had a four-point probe conductivity of 20 S-cm$^{-1}$.

Similar results were obtained by repeating the above experiment with chloroform, trichlorobenzene, toluene or decaline in place of xylene.

EXAMPLE 6

A quantity of 5 g of a solution as prepared in Example 2 was mixed with 0.17 g of ultra-high molecular weight polyethylene (UHMW PE Hostalen GR 412, weight average molecular weight of 2,000,000), 0.01 g of antioxidant and 17.4 ml of xylene and heated in an oil bath at 126.6° C. for 1 hour. The resulting hot solution was cast onto an aluminum plate. Xylene was removed by evaporation in air at room temperature. The polyaniline-DBSA complex content was found to 11.8% w/w in the film. Similar experiments were repeated, but the polyaniline-DBSA complex content was varied to be 7.1% and 13.4% w/w, respectively. Part of the films were stretched on a hot plate at 105° C. to a draw ratio $\lambda=40$ ($\lambda$=final length divided by initial length). The stretched films had outstanding mechanical properties: Young's modulus in excess of 70 GPa and tensile strength in excess of 2 GPa. The electrical conductivities of unstretched and stretched films, were measured using the standard four-probe method. The results are summarized in Table 2. The use of drawing in this example is an example of the general use of physical distortion of a conductive polymer structure to drastically improve the physical and electrical properties of the polymer. Any distortion, stretching, drawing or the like in amounts of about a 50% distortion through a 200-fold distortion can be used with advantage.

TABLE 2

Electrical Conductivity of UHMW PE Composite Films Containing PANI-DBSA

| PANI-DBSA | Conductivity (S-cm$^{-1}$) | |
|---|---|---|
| content (%) | unstretched | stretched |
| 7.1 | 8.4 × 10$^{-4}$ | 2.5 × 10$^{-2}$ |
| 11.8 | 2.9 × 10$^{-1}$ | 3.9 |
| 13.4 | 2.9 × 10$^{-2}$ | 11.5 |

This example demonstrates the feasibility of using this soluble form of conductive polyaniline in the preparation of high-performance polyolefins.

EXAMPLE B

A solution of 4.65 g (0.05 M) of freshly distilled aniline (Aldrich) and 24.48 g (0.075 M) of DBSA and 250 ml xylene was prepared in a 250 ml Erlenmeyer flask. The flask was placed in a bath that was maintained at 25° C. Polymerization was effected by the addition of an oxidant solution containing 4.68 g (0.02 M) of $(NH_4)_2S_2O_8$ (Aldrich) in 20 ml distilled water. After all oxidant was added (over a period of 30 min), the flask was capped and stirring was continued for 24 hours. The molar ratio of oxidant to aniline was 0.4; the monomer concentration was 0.2 M/L; and the ratio of DBSA to aniline was 1.5. A dark green mixture was formed.

The polymer emulsion was poured into 750 ml acetone and the polyaniline-DBSA complex precipitated. This powder was recovered, filtered and washed three times with 150 ml acetone and three times with 150 ml distilled water, and again three times with 150 ml acetone. Finally, the powder was dried in a vacuum desiccator for 48 hours at room temperature. The polyaniline-DBSA yield was 2.1 g. The DBSA/PhN ratio in the powder was ~0.3.

This example illustrates that conductive polyaniline-functionalized protonic acid complexes can be prepared directly from the aniline monomer.

This example further illustrates that one can use a protonic acid to solubilize the aniline in an organic solvent and that the solubilized aniline can be subjected to emulsion polymerization, a polymerization technique not available heretofore. In this process, the solvent can be varied as can the protonic acid and the relative proportions of reactants.

EXAMPLE C

Example B was repeated, but the polymerization temperature was 0° C. and polymerization time was 96 hours. In general terms, the temperature could be varied over the range of −10° C. through 100° C. with similar results. Times would vary inversely with temperature.

EXAMPLES D-G

Example B was repeated, but the molar ratio of DBSA to aniline was, respectively, 4.0, 3.0, 2.0 and 1.0. The experiment could also be repeated substituting other acids for DBSA.

EXAMPLES H-K

Example B was repeated, but the solvent for the polymerization was, respectively, chloroform (H), toluene (I), decaline (J),1,2,4-trichlorobenzene (K). Other low dielectric constant nonaqueous liquids could be employed, if desired.

EXAMPLE L

Example H was repeated, but the polymerization temperature was 0° C.

The yield of the above polymerizations was calculated from the ratio of the amount of emeraldine base, recovered after compensation (following the procedure of Example A), to the amount of initial aniline monomer. The electrical conductivity of the polyaniline-DBSA complexes of Examples B-L were determined by the usual four-probe method at room temperature on pressed pellets. The inherent viscosity (in dL/g) of the polyaniline-DBSA complex and of the emeraldine base obtained after compensation were determined at 25° C. in 97% $H_2SO_4$ (0.1% w/w polymer), using an Ubbelohde viscosimeter. The results are presented in Tables 3–5.

TABLE 3

Effect of Polymerization Temperature

| Example | Temperature (°C.) | Yield (%) | Conductivity (S/cm) | Viscosity (dL/g) complex | base |
|---|---|---|---|---|---|
| B | 25 | 32.4 | 3.7 | 0.99 | 1.27 |
| C | 0 | 32.6 | 1.0 | 1.21 | 1.70 |
| H | 25 | 33.6 | 0.8 | 1.26 | 1.67 |
| L | 0 | 36.9 | 0.5 | 1.92 | 2.61 |

The results in this Table illustrates that it is beneficial to carry out the emulsion polymerization at lower temperatures; it also reveals that the direct preparation of polyaniline-functionalized acid complexes in organic solvents may lead to significantly higher molecular weights of the polymer (cf. Example A).

TABLE 4

Effect of DBSA/Aniline Ratio

| Example | DBSA/aniline ratio | Yield (%) | Conductivity (S/cm) | Viscosity (dL/g) complex | base |
|---|---|---|---|---|---|
| D | 4.0 | 27.2 | 0.4 | 0.38 | 0.61 |
| E | 3.0 | 37.0 | 0.2 | 0.21 | 0.93 |
| F | 2.0 | 34.0 | 0.2 | 0.24 | 0.45 |
| B | 1.5 | 32.4 | 3.7 | 0.99 | 1.27 |
| G | 1.2 | 32.6 | 0.7 | 0.48 | 0.68 |

The results in this Table illustrate that polyaniline-functionalized acid complexes can be prepared directly over a wide range of DBSA/PhN ratios.

TABLE 5

Effect of Solvent

| Example | Solvent | Yield (%) | Conductivity (S/cm) | Viscosity (dL/g) complex | base |
|---|---|---|---|---|---|
| B | Xylene | 32.4 | 3.7 | 0.99 | 1.27 |
| H | CHCl$_3$ | 33.6 | 0.8 | 1.26 | 1.67 |
| I | Toluene | 36.7 | 1.2 | 1.09 | 1.35 |
| J | Decaline | 36.8 | 0.1 | 1.07 | 1.18 |
| K | Trichlorobenzene | 33.3 | 2.0 | 0.81 | 1.07 |

The results in this Table illustrate that the polyaniline-functionalized acid complexes can be prepared directly in various non-polar or weakly polar organic solvents.

EXAMPLE 7

The mixture of Example B was centrifuged at 4000 rpm for 1 hour immediately after termination of polymerization, prior to precipitation of polyaniline with acetone. The soluble part was decanted and washed three times with 400 mL of a 1:1 acetone/water mixture in separation funnel to eliminate excess DBSA and ammonium sulfate. A bright green solution of the polyaniline-DBSA complex in xylene was obtained, which was stable at room temperature during storage. No precipitate appeared during several months The content of the polyaniline-DBSA complex in the solution was determined by evaporation of the xylene, first in air followed by evacuation in vacuum at room temperature for 24 hours. A typical value of the content was 2% w/w for the polymerization conditions of Example B.

EXAMPLE 8

A mixture was prepared of 0.1 g of the material of Example B, 0.1 g of DBSA and 20 g xylene was treated in ultrasonic bath overnight. The resulting solution was decanted after centrifugation at 4000 rpm. The concentration of the polyaniline-DBSA complex in the solution was determined as in Example 3. Typically the value of this content was 0.5 % w/w. This example illustrates that the powder of Example B can be redissolved in xylene.

Similar results were obtained by repeating the above experiment with chloroform, trichlorobenzene, toluene or decaline (at 90 ° C.) in place of xylene.

EXAMPLE 9

A solution was prepared of 0.1 g of the material of Example L, 0.1 g of DBSA and 10 g xylene, according to the method of Example 8. Free standing films of the polyaniline-DBSA complex were obtained by casting from solution and drying at room temperature and subsequent washing with acetone. Typically, the electrical conductivity of the resulting free standing flexible films was ca. 240 S-cm$^{-1}$. Because the protonation level of the films obtained by this procedure was only 0.3, further protonation of the film with 1M aq. HCl solution increases the conductivity to 400 S-cm$^{-1}$.

This example illustrates that films were produced having values of the electrical conductivity that significantly exceed those commonly reported for polyaniline.

EXAMPLE 10

Figure 2:
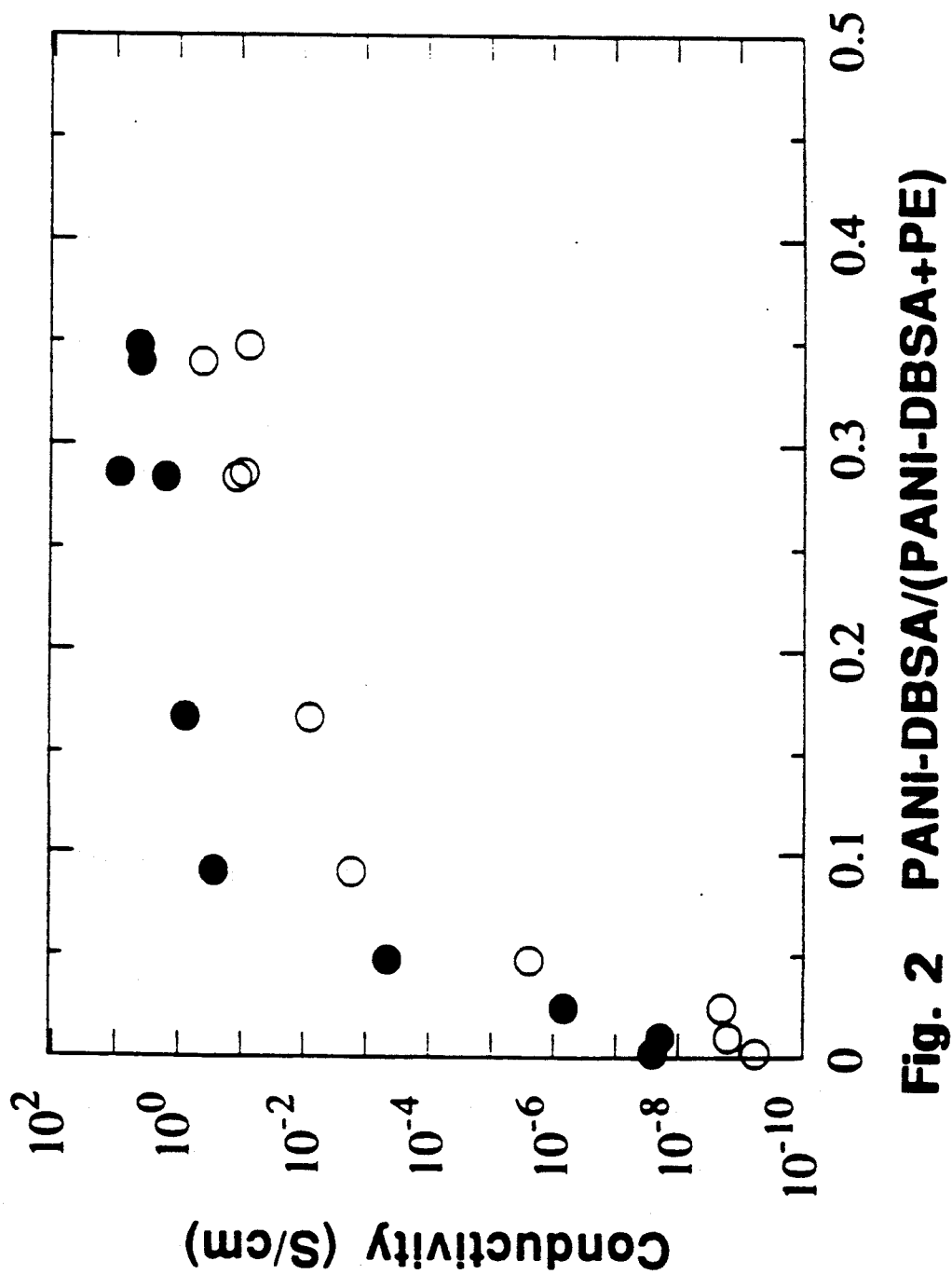
FIG. 2 is a graph of the four-probe electrical conductivity of polyblend films prepared from xylene solutions of polyaniline-DBSA complex and ultra-high molecular weight polyethylene versus the composition of the films. The open symbols are of undrawn, (isotropic) films; the filled circles are of the films that were stretched on a hot plate at 105° C. to a draw ratio of 40.

Films were prepared of ultra-high molecular weight polyethylene and the polyaniline-DBSA complex, according to the method of Example 6, but the solution of the conductive polyaniline was directly made according to the method of Example 7. The weight ratios of the polyaniline-DBSA complex to the total polymer content were varied from 0.002, 0.01, 0.024, 0.048, 0.09, 0.17, 0.29, 0.34 to 0.35. After drying the electrical conductivity of polyaniline/UHMW PE blend films were determined using the standard four-probe method. The results are given in FIG. 2.

The films were stretched on a hot plate at 105° C. to a draw ratio of 1=40. The stretched films exhibited a homogeneous distribution of the polyaniline-DBSA complex in the UHMW PE matrix; and high optical anisotropy was observed under the polarizing light. The electrical conductivity of stretched films were determined using the standard four-probe method. In comparison with the conductivity of unstretched films, the conductivity after drawing increased by 1–3 orders of magnitude depending on the composition of the films (see FIG. 2). The stretched films had outstanding mechanical properties.

This example demonstrates the feasibility of using this soluble form of conductive polyaniline in the preparation of high-performance polymer blends of excellent electrical and mechanical properties.

EXAMPLE 11

Figure 3:
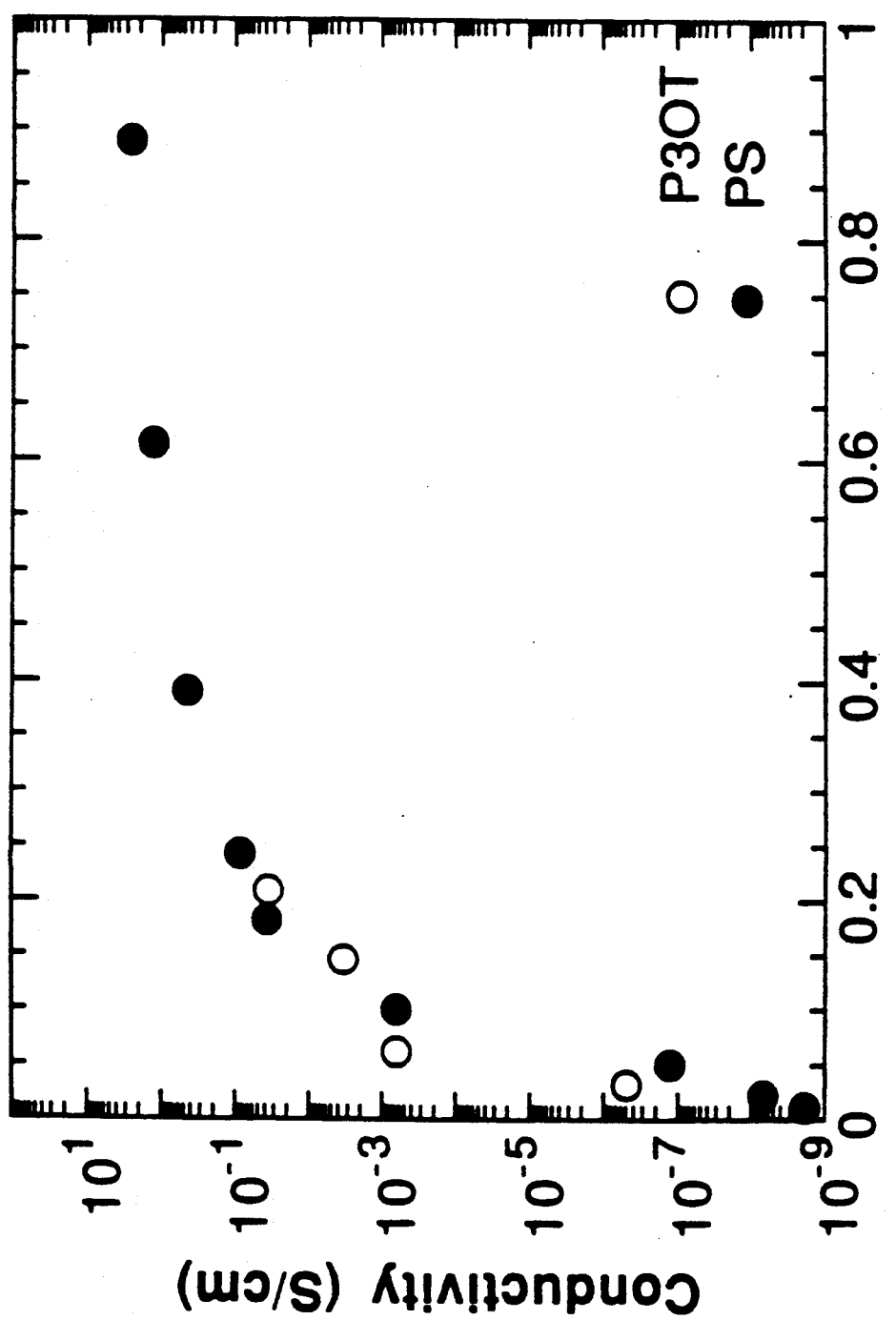
FIG. 3 is a graph of the four-probe electrical conductivity as a function of the composition of polyblends films that were prepared from chloroform solutions of polyaniline-DBSA complex and polystyrene or poly(3-octylthiophene). The open and filled symbols refer to polystyrene and poly(3-octylthiophene), respectively.

A solution was prepared at room temperature of 2.5 g of polystyrene (polyscience, $M_w$ 125,000–250,000) in 7.5 g chloroform, respectively. A solution of the conductive polyaniline was directly made according to the method of Example 7; and was added to the polystyrene/chloroform solution in amounts such that the weight ratios of polyaniline-DBSA to polystyrene in the chloroform solutions were 0.011, 0.022, 0.05, 0.1, 0.18, 0.24, 0.39, 0.62, 0.89, respectively. The viscous solutions were cast into films and the chloroform was evaporated in air at room temperature. Surprisingly clear and transparent films were thus obtained. The electrical conductivities of polyblend films were determined, using the standard four-probe method. The data are shown in FIG. 3.

This example demonstrates the feasibility of using the soluble conductive polyaniline to manufacture conductive articles of outstanding optical clarity.

EXAMPLE 12

Example 11 was repeated, but the host polymer was the conjugated polymer poly(3-octylthiophene) (Neste Oy, $M_w=125,000$) in stead of polystyrene. The weight ratios of polyaniline-DBSA to poly 3-octylthiophene) in the chloroform solutions were 0.032, 0.062, 0.15 and 0.21. The results of electrical conductivity measurements of the polyblend films are also shown in FIG. 3.

EXAMPLE 13

Polybutadiene (Aldrich), 1 g, and benzoylperoxide, 20 mg, were dissolved in 10 g of a polyaniline-DBSA solution in xylene, which was prepared according to the method of Example 7, at room temperature under stirring. A homogeneous solution was obtained which was cast onto a glass substrate. The solvent was removed by evaporation in air at room temperature. The final concentration of polyaniline-DBSA complex in the resulting polyblend film was 6% w/w. This film was cured in an oven at 160° C. for 20 minutes. A conductive and very elastic polyaniline-DBSA/polybutadiene rubber film was obtained. The film exhibited an electrical conductivity of $3\times10^{-6}$ S-cm$^{-1}$; the conductivity of the film before curing was $1\times10^{-1}$ S-cm$^{-1}$. The conductive elastomer could reversibly deformed to elongations as much as 600% without fracture.

EXAMPLE 14

Example 13 was repeated, but silicone rubber (Dow Corning RTV 738) was used in place of polybutadiene. This elastomer was cured at room temperature after evaporation of the xylene. The final concentration of the polyaniline-DBSA complex in the silicone rubber was 1% w/w. The conductivity of the elastomer was $1\times10^{-6}$ S-cm$^{-1}$. The above Examples 13 and 14 demonstrates that with the soluble polyaniline conductive articles can be manufacture of outstanding elastomeric properties.

EXAMPLE 15

The material of Example 1, in 2.66 g quantity, was mixed with 17.7 g of xylene (3% w/w) in an ultrasonic bath. After 2 hours a stable emulsion of the polyaniline-DBSA in xylene was obtained.

EXAMPLE 16

Films were prepared of ultra-high molecular weight polyethylene and the polyaniline-DBSA complex, according to the method of Example 6, but in place of the solution prepared according to the method of Example 8, the emulsion of Example 15 was used. The weight ratios of the polyaniline-DBSA complex to the total polymer content were varied from 0.42, 0.50, 0.60 and 0.70. After drying the electrical conductivity of the polyaniline/UHMW PE blend films were determined using the standard four-probe method. The results are given below in Table 6.

TABLE 6

| Electrical Conductivity of UHMW PE Composite Films Containing PANI-DBSA | |
|---|---|
| PANI-DBSA content (%) | Conductivity (S-cm$^{-1}$) |
| 20.1 | 0.3 |
| 42.0 | 0.1 |
| 60.0 | 1.2 |
| 70.0 | 2.0 |

This experiment shows that polyblend systems with a large content of the conductive polyaniline can be prepared.

EXAMPLE 17

The conductive form of polyaniline was prepared as in Example 1. Differential scanning calorimetry (DSC) scans of the material exhibited an exothermal peak at ca. 95° C. and an endothermal peak at ca. 150° C. The thermal stability of EB-DBSA complex was examined by thermogravimetric (TG) analysis (Mettler TA3000 system). The complex was stable at temperatures exceeding 270° C. Using a laboratory press at room temperature, the resulting mixture was pressed into a pellet at room temperature. After pumping for 96 hours in dynamic vacuum at room temperature, the electrical conductivity of the pellet of the polyaniline-DBSA complex was measured in a dry box filled with argon, using the standard four-probe method. The resulting conductivity was 26.4 S-cm$^{-1}$.

Remarkably it was observed that a coherent thin film was obtained by pressing at 160° C., which is indicative of the plastizing effect of the functionalized protonic acid. After pumping for 96 hours in dynamic vacuum at room temperature, the electrical conductivity of the film of the polyaniline-DBSA complex was measured in a dry box filled with argon. The resulting conductivity was as high as 92 S-cm$^{-1}$. This example shows how a fluid phase protonic acid such as DBSA can itself serve as a solvent/plasticizer. The acid can be fluid (liquid or semisolid) at room temperature or at an elevated temperature and achieve the advantages of the invention.

EXAMPLE 18

The nonconductive form of polyaniline of Example A, 0.091 g (0.001M), was mixed in an Agate mortar and pestle with 0.163 g DBSA (0.0005 M) and 0.254 g of powdery linear polyethylene (GR 2755; $M_w=200,000$) in a dry bag filled with nitrogen. The mixture was pressed at 165° C. between hot plates for 30 seconds; the 30 second hot-processing step was repeated three more times (for a total of four) to assure uniform mixing. Flow and mixing were observed to occur and tough and flexible films were obtained after cooling to room temperature. The weight ratio of the polyaniline-DBSA (DBSA/PhN=0.5) complex to the total polymer was 0.5.

EXAMPLE 19

Example 18 was repeated, but the amount of polyethylene was varied such that the weight ratio of the polyaniline-DBSA complex to the total polymer was 0.34, 0.20 and 0.11. Flow and mixing were observed to occur and tough and flexible films were obtained after cooling to room temperature. This example shows that in situations where the acid is fluid and serves as the liquid (solvent) phase one can additionally add a wide range of other polymers and achieve the desired conductivity properties.

EXAMPLE 20

Figure 4:
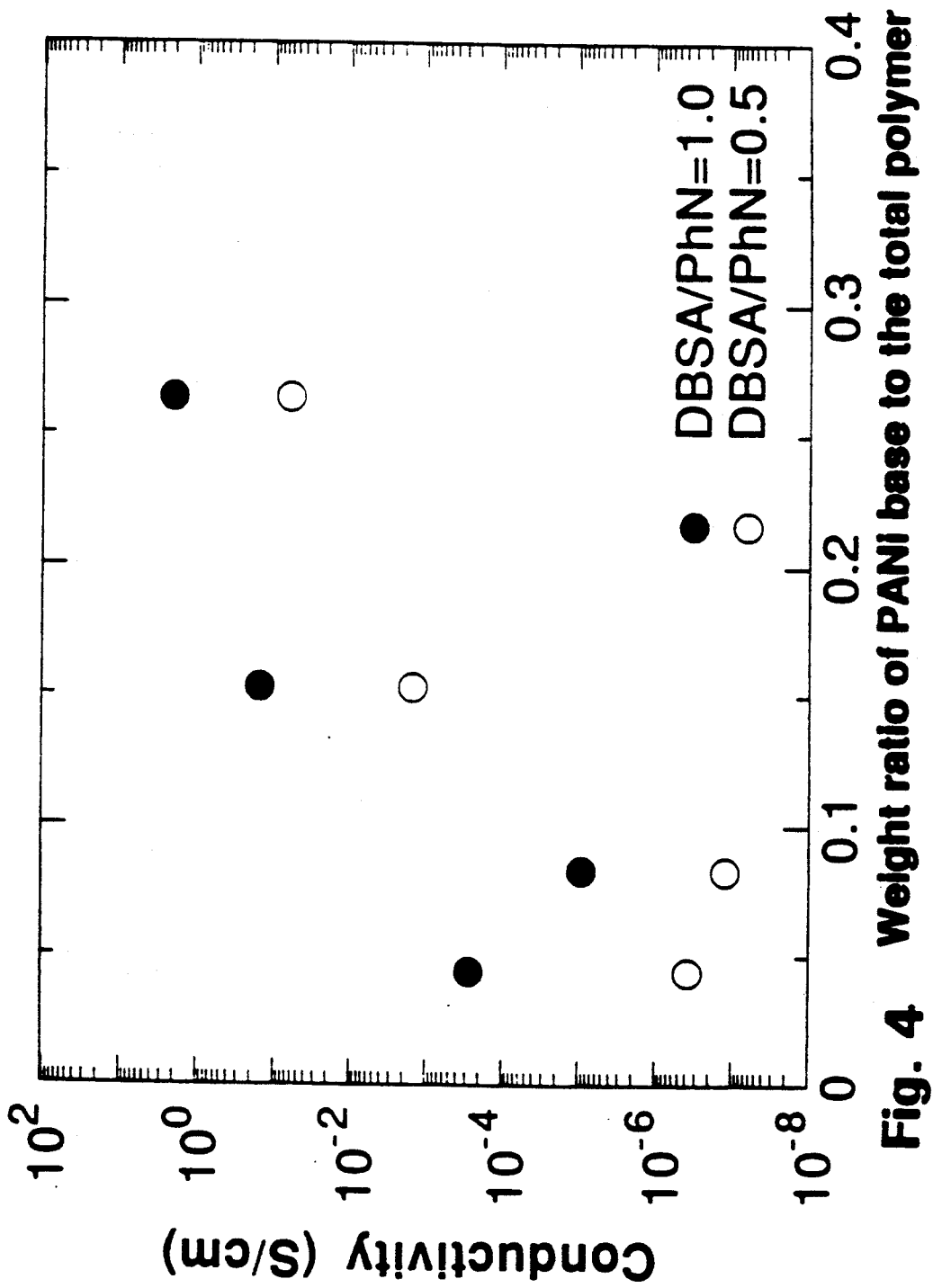
FIG. 4 is a graph of the four-probe electrical conductivity of polyblend films prepared from a melt of polyaniline-DBSA complex and polyethylene versus the composition of the films. The open and filled symbols refer to compositions in which the molar ratio of DBSA to aniline repeat unit (PhN) was 0.5 and 1.0, respectively.

The electrical conductivities of the materials of Examples 18-20 were measured using the standard four-probe method. The results are shown in FIG. 4.

These data show that this conductive form of polyaniline can be mixed in the melt with polyolefins to yield materials of excellent electrical and mechanical properties. The Examples 18-20 also show that molten polymers can be used as plasticizing liquids, and that additional amounts of the functionalized protonic acid can increase the conductivity through enhanced miscibility between the conductive polyaniline and polyethylene.

EXAMPLE 21

Figure 5:
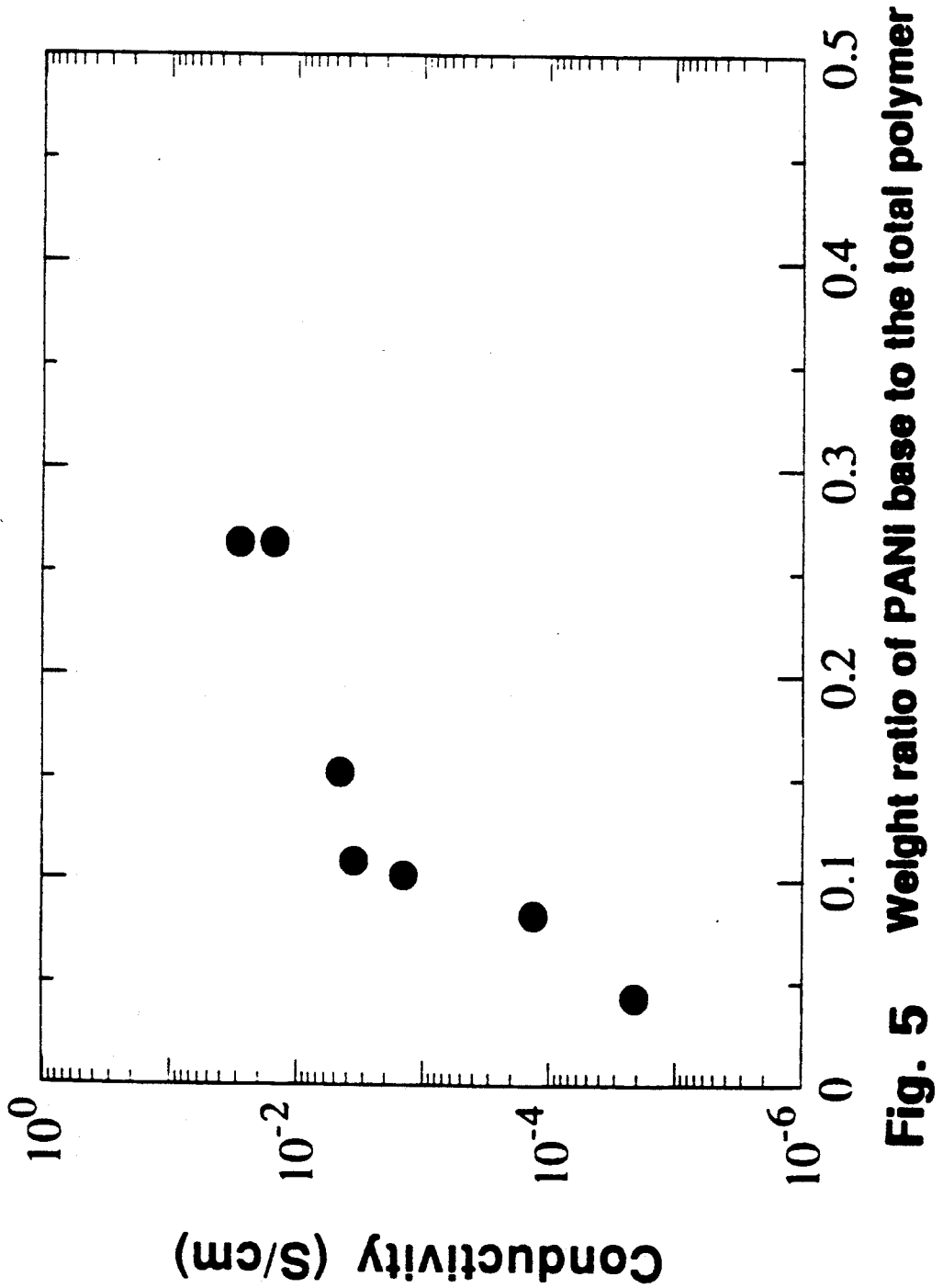
FIG. 5 is a graph of the four-probe electrical conductivity of polyblend films prepared from a melt of polyaniline-DBSA complex and nylon 12 versus the composition of the films.. The molar ratio of DBSA to aniline repeat unit (PhN) was 0.5.

Examples 18 and 19 were repeated, but in place of polyethylene powdery nylon 12 (Polysciences) was used. The mixture was pressed at 175° C. between hot plates for 30 seconds and subsequently re-pressed (again for 30 seconds). Flow and mixing were observed to occur and tough and flexible films were obtained after cooling to room temperature. The electrical conductivities of the films were measured using the four-probe method; the results are shown in FIG. 5.

Example 21 shows that this conductive form of polyaniline can be mixed in the melt with nylons to yield materials of excellent electrical and mechanical properties.

The examples also show that molten polymers and liquid protonic acids can be used as plasticizing liquids.

What is claimed is:

1. A conductive polymeric composition comprising polyaniline of film-forming molecular weight in admixture with an effective protonating amount of a protonic acid, said protonic acid including a counterion that is functionalized so as to be soluble in nonpolar or weakly polar organic solvent and form a complex with the polyaniline having a conductivity greater than about $10^{-3}$ S-cm$^{-1}$.

2. A conductive composition of claim 1 wherein the polyaniline is polyaniline having a molecular weight of greater than about 10,000 prepared by polymerizing an aniline of Formula 1:

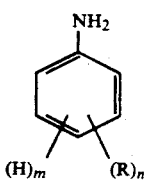

wherein:
n is an integer from 0 to 4;
m is an integer from 1 to 5 with the proviso that the sum of n and m is 5;
R is the same or different at each occurrence and is alkyl, alkenyl, alkoxy, cycloalkyl, cycloalkenyl, alkanoyl, alkylthio, aryloxy, alkylthioalkyl, alkylaryl, arylalkyl, alkylsulfinyl, alkoxyalkyl, alkylsulfonyl, aryl, arylthio, arylsulfinyl, alkoxycarbonyl, arylsulfonyl, carboxylic acid, halogen, cyano, or alkyl substituted with one or more sulfonic acid, carboxylic acid, halogen, nitro, cyano or epoxy moieties; or any two R substituents taken together are an alkylene or alkenylene group completing a 3, 4, 5, 6 or 7 membered aromatic or alicyclic carbon ring, which ring may include one or more divalent heteroatoms of nitrogen, sulfur, sulfinyl, sulfonyl or oxygen.

3. A conductive polymeric composition according to claim 2 wherein said polyaniline is of the Formulas II to V:

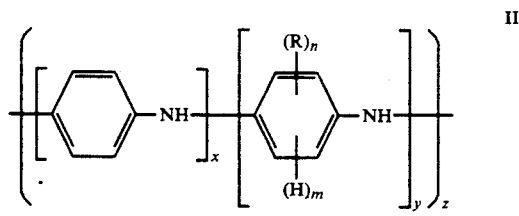

or

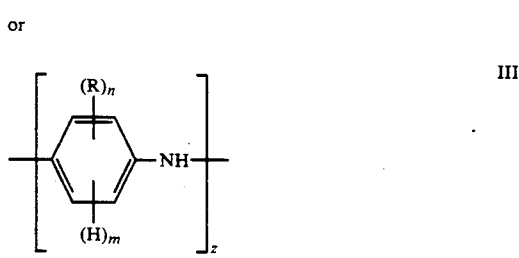

or

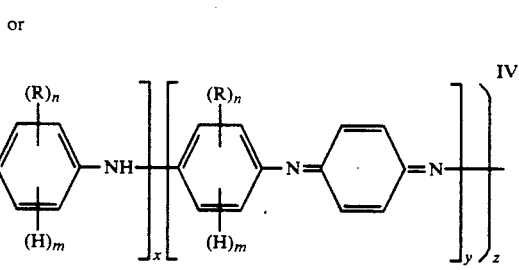

or

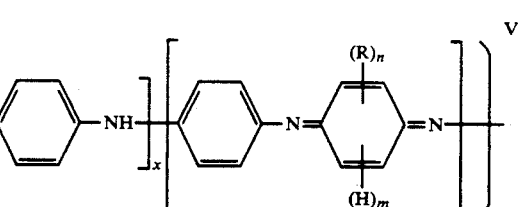

wherein:
x is an integer equal to or greater than 1;
y is an integer equal to or greater than 0, with the proviso that the sum of x and y is greater than 8;
z is an integer greater than 1;
n is an integer from 0 to 4;
m is an integer from 0 to 4 with the proviso that the sum of n and m is 4;
R is the same or different at each occurrence and is alkyl, alkenyl, alkoxy, cycloalkyl, cycloalkenyl, alkanoyl, alkylthio, aryloxy, alkylthioalkyl, alkylaryl, arylalkyl, alkylsulfinyl, alkoxyalkyl, alkylsulfonyl, aryl, arylthio, arylsulfinyl, alkoxycarbonyl, arylsulfonyl, carboxylic acid, halogen, cyano, or alkyl substituted with one or more sulfonic acid, carboxylic acid, halogen, nitro, cyano or epoxy moieties; or any two R substituents taken together are an alkylene or alkenylene group completing a 3, 4, 5, 6 or 7 membered aromatic or alicyclic carbon ring, which ring may include one or more divalent heteroatoms of nitrogen, sulfur, sulfinyl, sulfonyl or oxygen.

4. A conductive polymeric composition according to claim 2 wherein m is equal to 5 and n is 0 such that the aniline is unsubstituted aniline.

5. A conductive polymeric composition according to claim 2 wherein n is greater than 0 such that said polyaniline is derived from substituted aniline.

6. A conductive polymeric composition according to claim 2 wherein R is the same or different at each occurrence and is alkyl or alkoxy having from 1 to about 12 carbon atoms, cyano, halogen or alkyl having from 1 to about 12 carbon atoms substituted with carboxylic acid or sulfonic acid substituents.

7. A conductive polymeric composition according to claim 6 wherein R is the same or different at each occurrence and is alkyl or alkoxy having form 1 to about 4 carbon atoms, or substituted alkyl having from 1 to about 4 carbon atoms wherein permissible substituents are alkyl, carboxylic acid and sulfonic acid substituents.

8. A conductive polymeric composition according to claim 7 wherein R is the same or different at each occurrence and is alkyl having from 1 to about 4 carbon atoms.

9. A conductive polymeric composition according to claim 6 wherein n is 1 to 4.

10. A conductive polymeric composition according to claim 9 wherein n is 1.

11. A conductive polymeric composition according to claim 3 wherein z is equal to or greater than about 5.

12. A conductive polymeric composition according to claim 11 wherein z is equal to or greater than about 10.

13. A conductive polymeric composition according to claim 12 wherein z is equal to or greater than about 15.

14. A conductive polymeric composition according to claim 3 wherein x is from 0 to about 8 and y is from 0 to about 8, with the proviso that the sum of x and y is at least about 8.

15. A conductive polymeric composition according to claim 14 wherein x is from about 1 to about 8 and y is from 0 to about 7, with the proviso that the sum of x and y is at least about 8.

16. A conductive polymeric composition according to claim 15 wherein x is from about 2 to about 8 and y is from 0 to about 6 with the proviso that the sum of x and y is at least about 8.

17. A conductive polymeric composition according to claim 1 wherein the protonic acid has a counterion that is soluble in non-polar or weakly polar organic solvent, molten or liquidified oligomer or polymer and said protonic acid is of the Formula VI or VII:

$$A-R_1 \quad VI$$

or

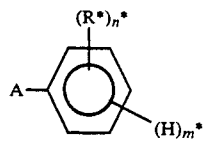

VII wherein:
A is sulfonic acid, selenic acid, phosphonic acid, a carboxylic acid, hydrogen sulfate, hydrogen selenate, or hydrogen phosphate;
$n^*$ is an integer from 0 to 5;
$m^*$ is an integer from 1 to 4 with the proviso that the sum of $n^*$ and $m^*$ is 5;
$R_1$ is alkyl, alkenyl, alkoxy, alkanoyl, alkylthio, alkylthioalkyl, having from 1 to about 20 carbon atoms; or alkylaryl, arylalkyl, alkylsulfinyl, alkoxyalkyl, alkylsulfonyl, alkoxycarbonyl, carboxylic acid, where the alkyl or alkoxy has from 0 to about 20 carbon atoms; or alkyl having from 3 to about 20 carbon atoms substituted with one or more sulfonic acid, carboyxlic acid, halogen, nitro, cyano, diazo, or epoxy moieties; or a substituted or unsubstituted 3, 4, 5, 6 or 7 membered aromatic or alicyclic carbon ring, which ring may include one or more divalent heteroatoms of nitrogen, sulfur, sulfinyl, sulfonyl or oxygen such as thiophenyl, pyrolyl, furanyl, pyridinyl; or a polymer backbone to which a plurality of A units are attached;
$R^*$ is the same or different at each occurrence and is alkyl, alkenyl, alkoxy, cycloalkyl, cycloalkenyl, alkanoyl, alkylthio, aryloxy, alkylthioalkyl, alkylaryl, arylalkyl, alkylsulfinyl, alkoxyalkyl, alkylsulfonyl, aryl, arylthio, arylsulfinyl, alkoxycarbonyl, arylsulfonyl, carboxylic acid, halogen, cyano, or alkyl substituted with one or more sulfonic acid, carboxylic acid, halogen, nitro, cyano, diazo or epoxy moieties; or any two R substituents taken together are an alkylene or alkenylene group completing a 3, 4, 5, 6 or 7 membered aromatic or alicyclic carbon ring or multiples thereof, which ring or rings may include one or more divalent heteroatoms of nitrogen, sulfur, sulfinyl, sulfonyl or oxygen.

18. A conductive polymeric composition according to claim 17 wherein $m^*$ is 4 and $n^*$ is 1.

19. A conductive polymeric composition according to claim 17 wherein A is sulfonic acid.

20. A conductive polymeric composition according to claim 1 7 wherein the protonic acid includes $R_1$, which is alkyl, alkenyl, alkoxy, alkanoyl, alkylthio, alkylthioalkyl, having from 5 to about 16 carbon atoms, or alkyl having from 3 to about carbon atoms substituted with one or more sulfonic acid, carboxylic acid, halogen, nitro, cyano or epoxy moieties.

21. A conductive polymeric composition according to claim 17 wherein the protonic acid includes $R^*$, which is the same or different at each occurrence and is alkyl, alkenyl or alkoxy, having from 3 to about 12 carbon atoms or alkyl substituted with one or more carboxylic acid, halogen, nitro, cyano or epoxy moieties.

22. A conductive polymeric composition of claim 1 additionally comprising a liquid solvent having a dielectric constant smaller than about 22.

23. A conductive polymeric composition according to claim 22 wherein said solvent is selected from the group consisting of organic solvent and molten or liquidified oligomer or polymer having a dielectric constant smaller than about 22.

24. A conductive polymeric composition according to claim 23 wherein said solvent has a dielectric constant smaller than about 15.

25. A conductive polymeric composition according to claim 24 wherein said solvent has a dielectric constant smaller than about 10.

26. A conductive polymeric composition according to claim 24 wherein said solvent is a solvent selected from the group consisting of alkanes and alkenes having from about 5 to about 12 carbon atoms, mineral oil, aromatics, halogenated aromatics, halogenated alkanes, and aliphatic alcohols, alkyl ethers and ketones having from 4 to about 12 carbon atoms, cycloalkanes, cycloalkenes, carbontetrachloride, carbon disulfide, chloroform, bromoform, dichloromethane, morpholine, aniline, alkylbenzenes, xylene, toluene, decahydronaphthalene, styrene, and naphthalene.

27. A conductive polymeric composition according to claim 26 wherein said solvent is selected from the group consisting of alkanes and alkenes having from about 5 to about 12 carbon atoms, mineral oil, aromatics, halogenated aromatics, halogenated carbons, and aliphatic alcohols, alkyl ethers and ketones having from 4 to about 12 carbon atoms, carbontetrachloride, chloroform, aniline, xylene, toluene, decahydronaphthalene and styrene.

28. A conductive polymeric composition according to claim 1 wherein the protonic acid is a liquid having a dielectric constant equal to or smaller than about 22 and wherein said protonic acid serves as solvent as well.

29. A conductive polymeric composition according to claim 1 wherein said solvent is a liquidified or molten oligomer or polymer selected from the group comprising hexatriacontane, dotriadecane, octadodecane, polyethylenes, isotactic polypropylene, polystyrene, poly(ethylvinylacetate), polybutadiene, polyisoprene, ethylenevinylene-copolymers, ethylene-propylene copolymers, poly(ethyleneterephthalate), poly(butyleneterephthalate), nylon 12, nylon 8, nylon 6, and nylon 6.6.

30. A conductive polymeric composition according claim 1 wherein said conductivity is at least about $10^{-2}$ S-cm$^{-1}$.

31. A conductive polymeric composition according to claim 30 wherein said conductivity is at least about $10^{-1}$ S-cm$^{-1}$.

32. A conductive polymeric composition according to claim 31 wherein said conductivity is at least about 1 S-cm$^{-1}$.

33. A conductive polymeric composition according to claim 1 wherein said conductive polymeric composition is a solution.

34. A conductive polymeric composition according to claim 1 wherein said conductive polymeric composition is a plasticized solid.

35. A conductive polymeric composition according to claim 22 wherein said conductive polymeric composition comprises less than 10 weight percent of the total of polymeric composition plug liquid solvent.

36. A conductive polymeric composition according to claim 35 wherein said conductive polymeric composition comprises less than 1 weight percent of the total of polymeric composition plus liquid solvent.

37. A conductive polymeric composition according to claim 36 wherein said conductive polymeric composition comprises less than 0.1 weight percent of the total of polymeric composition plus liquid solvent.

38. A conductive polymeric composition of claim 1 comprising polyaniline and dodecylbenzenesulfonic acid.

39. A conductive polymeric composition according to claim 38 having a conductivity equal to or greater than about $10^{-1}$ S-cm$^{-1}$.

40. A conductive polymeric composition according to claim 39 having a conductivity equal to or greater than about $10^1$ S-cm$^{-1}$.

41. A conductive polymeric composition according to claim 1 prepared in situ by emulsion polymerization.

42. A conductive polymeric composition according to claim 22 wherein said liquid solvent is a monomer.

* * * * *